US012127388B2

(12) United States Patent
Moriwaki

(10) Patent No.: US 12,127,388 B2
(45) Date of Patent: Oct. 22, 2024

(54) SEMICONDUCTOR STORAGE DEVICE

(71) Applicant: Socionext Inc., Kanagawa (JP)

(72) Inventor: Shinichi Moriwaki, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 414 days.

(21) Appl. No.: 17/539,695

(22) Filed: Dec. 1, 2021

(65) Prior Publication Data
US 2022/0093613 A1    Mar. 24, 2022

Related U.S. Application Data

(63) Continuation of application No. PCT/JP2020/020975, filed on May 27, 2020.

(30) Foreign Application Priority Data

Jun. 3, 2019  (JP) ................. 2019-103722

(51) Int. Cl.
| | | |
|---|---|---|
| H01L 21/78 | (2006.01) | |
| H01L 29/06 | (2006.01) | |
| H01L 29/423 | (2006.01) | |
| H01L 29/775 | (2006.01) | |
| H01L 29/786 | (2006.01) | |
| H10B 10/00 | (2023.01) | |

(52) U.S. Cl.
CPC ....... H10B 10/125 (2023.02); H01L 29/0673 (2013.01); H01L 29/42392 (2013.01); H01L 29/775 (2013.01); H01L 29/78696 (2013.01)

(58) Field of Classification Search
CPC .............. H10B 10/125; H01L 29/0673; H01L 29/42392; H01L 29/775; H01L 29/78696; H01L 27/0688; H01L 27/0207; H01L 29/165; H01L 27/092; G11C 8/16; G11C 11/412; B82Y 10/00
See application file for complete search history.

(56) References Cited

U.S. PATENT DOCUMENTS

| | | |
|---|---|---|
| 5,517,038 A | 5/1996 | Maeda et al. |
| 9,362,292 B1* | 6/2016 | Liaw .............. H01L 21/823885 |
| 10,211,206 B1* | 2/2019 | Zang ................. H01L 27/092 |

(Continued)

FOREIGN PATENT DOCUMENTS

| | | | |
|---|---|---|---|
| CN | 109860182 A | * 6/2019 | ....... H01L 21/02532 |
| JP | H06-061452 A | 3/1994 | |

(Continued)

OTHER PUBLICATIONS

Ryckaert J. et al., "The Complementary FET (CFET) for CMOS scaling beyond N3," 2018 Symposium on VLSI Technology Digest of Technical Papers; 2018 IEEE pp. 141-142.
A. Mocuta et al., "Enabling CMOS Scaling Towards 3nm and Beyond," 2018 Symposium on VLSI Technology Digest of Technical Papers, 2018 IEEE, pp. 147-148.
International Search Report issued in International Patent Application No. PCT/JP2020/020975, mailed on Aug. 4, 2020; with partial English translation.

(Continued)

Primary Examiner — Mohammed Shamsuzzaman
(74) Attorney, Agent, or Firm — Rimon P.C.

(57) ABSTRACT

Transistors N1, N5 corresponding to a drive transistor PD1 are formed in a cell lower part and a cell upper part, respectively, and transistors N2, N6 corresponding to a drive transistor PD2 are formed in the cell lower part and the cell upper part, respectively. A transistor P1 corresponding to a load transistor PU2 is formed in the cell lower part, and a transistor P2 corresponding to a load transistor PU1 is formed in the cell upper part.

1 Claim, 20 Drawing Sheets

(56) References Cited

U.S. PATENT DOCUMENTS

| | | |
|---|---|---|
| 2009/0294861 A1 | 12/2009 | Thomas et al. |
| 2013/0181274 A1 | 7/2013 | Saitoh et al. |
| 2015/0137262 A1* | 5/2015 | Baek ................... H01L 27/1211 257/401 |
| 2015/0325444 A1 | 11/2015 | Masuoka et al. |
| 2020/0035686 A1* | 1/2020 | Paul ................... H01L 29/78654 |
| 2020/0372952 A1* | 11/2020 | Moriwaki .............. H10B 10/18 |
| 2021/0035986 A1* | 2/2021 | Yu .......................... H10B 10/12 |
| 2022/0199630 A1* | 6/2022 | Ye ................... H01L 21/823807 |
| 2023/0038024 A1* | 2/2023 | Zhang ................... G11C 11/418 |
| 2023/0317148 A1* | 10/2023 | Ong ...................... G11C 11/412 365/154 |
| 2023/0317612 A1* | 10/2023 | Ong ................ H01L 21/823871 257/288 |
| 2023/0345692 A1* | 10/2023 | Chafik ................ H01L 29/6653 |
| 2023/0413504 A1* | 12/2023 | Liu ................... H01L 29/42392 |
| 2023/0413505 A1* | 12/2023 | Liu ..................... H01L 29/0673 |

FOREIGN PATENT DOCUMENTS

| | | | |
|---|---|---|---|
| JP | 2009-295975 A | 12/2009 | |
| JP | 2013-143536 A | 7/2013 | |
| WO | 2014/184933 A1 | 11/2014 | |
| WO | 2014/185085 A1 | 11/2014 | |
| WO | WO-2020070830 A1 * | 4/2020 | ......... G11C 11/4085 |
| WO | WO-2021125094 A1 * | 6/2021 | .......... H01L 27/1108 |

OTHER PUBLICATIONS

Written Opinion of the International Searching Authority issued in International Patent Application No. PCT/JP2020/020975, mailed Aug. 4, 2020; with partial English translation.

* cited by examiner

SEMICONDUCTOR STORAGE DEVICE

CROSS-REFERENCE TO RELATED APPLICATIONS

This is a continuation of International Application No. PCT/JP2020/020975 filed on May 27, 2020, which claims priority to Japanese Patent Application No. 2019-103722 filed on Jun. 3, 2019. The entire disclosures of these applications are incorporated by reference herein.

BACKGROUND

The present disclosure relates to a semiconductor storage device provided with three-dimensional transistors, and more particularly to a layout structure of a two-port static random access memory (SRAM) cell using three-dimensional transistors.

SRAM is widely used in semiconductor integrated circuits. As a type of SRAM, two-port SRAM having two ports for data read/write is known (e.g., see U.S. Pat. No. 9,362,292 (FIG. 1)).

As for transistors as basic constituents of an LSI, scaling down of the gate length has led to the improvement in integration degree, the reduction in operating voltage, and the improvement in operating speed. Recently, however, increase in off current due to excessive scaling and the resulting significant increase in power consumption have raised a problem. To solve this problem, three-dimensional transistors having a three-dimensional structure changed from the conventional planar structure have been vigorously studied.

Ryckaert J. et al., "The Complementary FET (CFET) for CMOS Scaling Beyond N3," 2018 Symposium on VLSI Technology Digest of Technical Papers and A. Mocuta et al., "Enabling CMOS Scaling Towards 3 nm and Beyond," 2018 Symposium on VLSI Technology Digest of Technical Papers disclose three-dimensional devices in which three-dimensional p-type FET and n-type FET are stacked vertically to a substrate, as novel devices, and SRAM cells (hereinafter also called cells simply) using such devices.

As used herein, a three-dimensional device in which three-dimensional p-type FET and n-type FET are stacked vertically to a substrate is called a complementary FET (CFET) following the cited paper by Ryckaert J. et al. Also, the direction vertical to the substrate is herein called the depth direction.

Until now, however, no concrete examination has been made on the layout of a two-port SRAM cell using CFETs.

An objective of the present disclosure is providing a layout structure of a two-port SRAM cell using CFETs.

SUMMARY

According to the first mode of the present disclosure, a semiconductor storage device including a two-port SRAM cell is provided. The two-port SRAM cell includes: a first transistor with one of its nodes connected to a first power supply that supplies a first voltage, the other node connected to a first node, and its gate connected to a second node; a second transistor with one of its nodes connected to the first power supply, the other node connected to the second node, and its gate connected to the first node; a third transistor with one of its nodes connected to the first node, the other node connected to a second power supply that supplies a second voltage, and its gate connected to the second node; a fourth transistor with one of its nodes connected to the second node, the other node connected to the second power supply, and its gate connected to the first node; a fifth transistor with one of its nodes connected to a first bit line, the other node connected to the first node, and its gate connected to a first word line; a sixth transistor with one of its nodes connected to a second bit line constituting a first complementary bit line pair with the first bit line, the other node connected to the second node, and its gate connected to the first word line; a seventh transistor with one of its nodes connected to a third bit line, the other node connected to the first node, and its gate connected to a second word line; and an eighth transistor with one of its nodes connected to a fourth bit line constituting a second complementary bit line pair with the third bit line, the other node connected to the second node, and its gate connected to the second word line. The third and fourth transistors are each constituted by a first three-dimensional transistor of a first conductivity type formed in a first layer, and a second three-dimensional transistor of the first conductivity type formed in a second layer different from the first layer. The first transistor is constituted by a three-dimensional transistor of a second conductivity type different from the first conductivity type formed in the second layer. The second transistor is constituted by a three-dimensional transistor of the second conductivity type formed in the first layer. The fifth to eighth transistors each include a three-dimensional transistor of the first conductivity type formed in at least one of the first and second layers.

According to the present disclosure, a two-port SRAM circuit is made up of the first to eighth transistors. The third and fourth transistors are each constituted by a three-dimensional transistor of the first conductivity type formed in the first layer and a three-dimensional transistor of the first conductivity type formed in the second layer. The first transistor is constituted by a three-dimensional transistor of the second conductivity type formed in the second layer. The second transistor is constituted by a three-dimensional transistor of the second conductivity type formed in the first layer. The fifth to eighth transistors each include a three-dimensional transistor of the first conductivity type formed in at least one of the first and second layers. That is, the first to eighth transistors making up the two-port SRAM circuit are all constituted by three-dimensional transistors. In this way, a two-port SRAM cell using CFETs can be implemented.

According to the second mode of the present disclosure, a semiconductor storage device including a two-port SRAM cell is provided. The two-port SRAM cell includes: a first transistor with one of its nodes connected to a first power supply that supplies a first voltage, the other node connected to a first node, and its gate connected to a second node; a second transistor with one of its nodes connected to the first power supply, the other node connected to the second node, and its gate connected to the first node; a third transistor with one of its nodes connected to the first node, the other node connected to a second power supply that supplies a second voltage, and its gate connected to the second node; a fourth transistor with one of its nodes connected to the second node, the other node connected to the second power supply, and its gate connected to the first node; a fifth transistor with one of its nodes connected to a first bit line, the other node connected to the first node, and its gate connected to a first word line; a sixth transistor with one of its nodes connected to a second bit line constituting a first complementary bit line pair with the first bit line, the other node connected to the second node, and its gate connected to the first word line; a seventh transistor with one of its nodes connected to a third bit line, the other node connected to the first node, and its gate connected to a second word line; and an eighth transistor with one of its nodes connected to a fourth bit line constituting a second complementary bit line pair with the third bit line, the other node connected to the second node, and its gate connected to the second word line. The third and fourth transistors are each constituted by a first three-dimensional transistor of a first conductivity type formed in a first layer, and a second three-dimensional transistor of the first conductivity type formed in a second layer different from the first layer. The first and second transistors are each constituted by a three-dimensional transistor of a second conductivity type different from the first conductivity type formed in the second layer. The fifth to eighth transistors each include a three-dimensional transistor of the first conductivity type formed in at least one of the first and second layers.

According to the present disclosure, a two-port SRAM circuit is made up of the first to eighth transistors. The third and fourth transistors are each constituted by a three-dimensional transistor of the first conductivity type formed in the first layer and a three-dimensional transistor of the first conductivity type formed in the second layer. The first and second transistors are each constituted by a three-dimensional transistor of the second conductivity type formed in the second layer. The fifth to eighth transistors each include a three-dimensional transistor of the first conductivity type formed in at least one of the first and second layers. That is, the first to eighth transistors making up the two-port SRAM circuit are all constituted by three-dimensional transistors. In this way, a two-port SRAM cell using CFETs can be implemented.

According to the third mode of the present disclosure, a semiconductor storage device including a two-port SRAM cell is provided. The two-port SRAM cell includes: a first transistor with one of its nodes connected to a first power supply that supplies a first voltage, the other node connected to a first node, and its gate connected to a second node; a second transistor with one of its nodes connected to the first power supply, the other node connected to the second node, and its gate connected to the first node; a third transistor with one of its nodes connected to the first node, the other node connected to a second power supply that supplies a second voltage, and its gate connected to the second node; a fourth transistor with one of its nodes connected to the second node, the other node connected to the second power supply, and its gate connected to the first node; a fifth transistor with one of its nodes connected to a first bit line, the other node connected to the first node, and its gate connected to a first word line; a sixth transistor with one of its nodes connected to a second bit line constituting a first complementary bit line pair with the first bit line, the other node connected to the second node, and its gate connected to the first word line; a seventh transistor with one of its nodes connected to a third bit line, the other node connected to the first node, and its gate connected to a second word line; and an eighth transistor with one of its nodes connected to a fourth bit line constituting a second complementary bit line pair with the third bit line, the other node connected to the second node, and its gate connected to the second word line. The third and fourth transistors are each constituted by a plurality of first three-dimensional transistors of a first conductivity type formed in a first layer. The plurality of first three-dimensional transistors are formed side by side in a second direction perpendicular to a first direction, the first direction being a direction in which channel portions of the first to eighth transistors extend. The first and second transistors are each constituted by a three-dimensional transistor of a second conductivity type different from the first conductivity type formed in a second layer located above the first layer, and overlap the third and fourth transistors, respectively, at least partly as viewed in plan. The fifth to eighth transistors each include a three-dimensional transistor of the first conductivity type formed in at least one of the first and second layers.

According to the present disclosure, a two-port SRAM circuit is made up of the first to eighth transistors. The third and fourth transistors are each constituted by a plurality of three-dimensional transistors of the first conductivity type formed in the first layer side by side in the second direction. The first and second transistors are each constituted by a three-dimensional transistor of the second conductivity type formed in the second layer. The fifth to eighth transistors each include a three-dimensional transistor of the first conductivity type formed in at least one of the first and second layers. That is, the first to eighth transistors making up the two-port SRAM circuit are all constituted by three-dimensional transistors. In this way, a two-port SRAM cell using CFETs can be implemented.

Also, the first and second transistors overlap the third and fourth transistors, respectively, at least partly as viewed in plan. That is, the first and second transistors are in a stacked state with the third and fourth transistors, respectively. This can reduce the area of the two-port SRAM cell.

Thus, in addition to implementing a two-port SRAM cell using CFETs, it is possible to reduce the area of the two-port SRAM cell.

According to the fourth mode of the present disclosure, a semiconductor storage device including first and second two-port SRAM cells is provided. The first and second two-port SRAM cells each include: a first transistor with one of its nodes connected to a first power supply that supplies a first voltage, the other node connected to a first node, and its gate connected to a second node; a second transistor with one of its nodes connected to the first power supply, the other node connected to the second node, and its gate connected to the first node; a third transistor with one of its nodes connected to the first node, the other node connected to a second power supply that supplies a second voltage, and its gate connected to the second node; a fourth transistor with one of its nodes connected to the second node, the other node connected to the second power supply, and its gate connected to the first node; a fifth transistor with one of its nodes connected to a first bit line, the other node connected to the first node, and its gate connected to a first word line; a sixth transistor with one of its nodes connected to a second bit line constituting a first complementary bit line pair with the first bit line, the other node connected to the second node, and its gate connected to the first word line; a seventh transistor with one of its nodes connected to a third bit line, the other node connected to the first node, and its gate connected to a second word line; and an eighth transistor with one of its nodes connected to a fourth bit line constituting a second complementary bit line pair with the third bit line, the other node connected to the second node, and its gate connected to the second word line. The first and second two-port SRAM cells are placed adjacent to each other in a second direction perpendicular to a first direction, the first direction being a direction in which channel portions of the first to eighth transistors extend. In each of the first and second two-port SRAM cells, the third and fourth transistors each include a three-dimensional transistor of a first conductivity type formed in a first layer, the first transistor includes a three-dimensional transistor of a second conductivity type different from the first conductivity type formed in a second layer different from the first layer, the second transistor includes a three-dimensional transistor of the second conductivity type formed in at least one of the first and second layers, and the fifth to eighth transistors each include a three-dimensional transistor of the first conductivity type formed in at least one of the first and second layers. The fifth and seventh transistors in the first two-port SRAM cell overlap the sixth and eighth transistors in the second two-port SRAM cell, respectively, at least partly as viewed in plan.

According to the present disclosure, in each of the first and second two-port SRAM cells, a two-port SRAM circuit is made up of the first to eighth transistors provided in each of the cells. The third and fourth transistors each include a three-dimensional transistor of the first conductivity type formed in the first layer. The first transistor includes a three-dimensional transistor of the second conductivity type formed in the second layer. The second transistor includes a three-dimensional transistor of the second conductivity type formed in at least one of the first and second layers. The fifth to eighth transistors each include a three-dimensional transistor of the first conductivity type formed in at least one of the first and second layers. That is, the first to eighth transistors making up the two-port SRAM circuit are all constituted by three-dimensional transistors. In this way, a two-port SRAM cell using CFETs can be implemented.

Also, the first and second two-port SRAM cells are placed adjacent to each other in the second direction, and the fifth and seventh transistors in the first two-port SRAM cell overlap the sixth and eighth transistors, respectively, in the second two-port SRAM cell at least partly as viewed in plan. That is, the fifth and seventh transistors in the first two-port SRAM cell are in a stacked state with the sixth and eighth transistors, respectively, in the second two-port SRAM cell. This can reduce the area of the two-port SRAM cell.

Thus, in addition to implementing a two-port SRAM cell using CFETs, it is possible to reduce the area of the two-port SRAM cell.

According to the present disclosure, a two-port SRAM cell using CFETs can be implemented.

DETAILED DESCRIPTION

Figure 17:
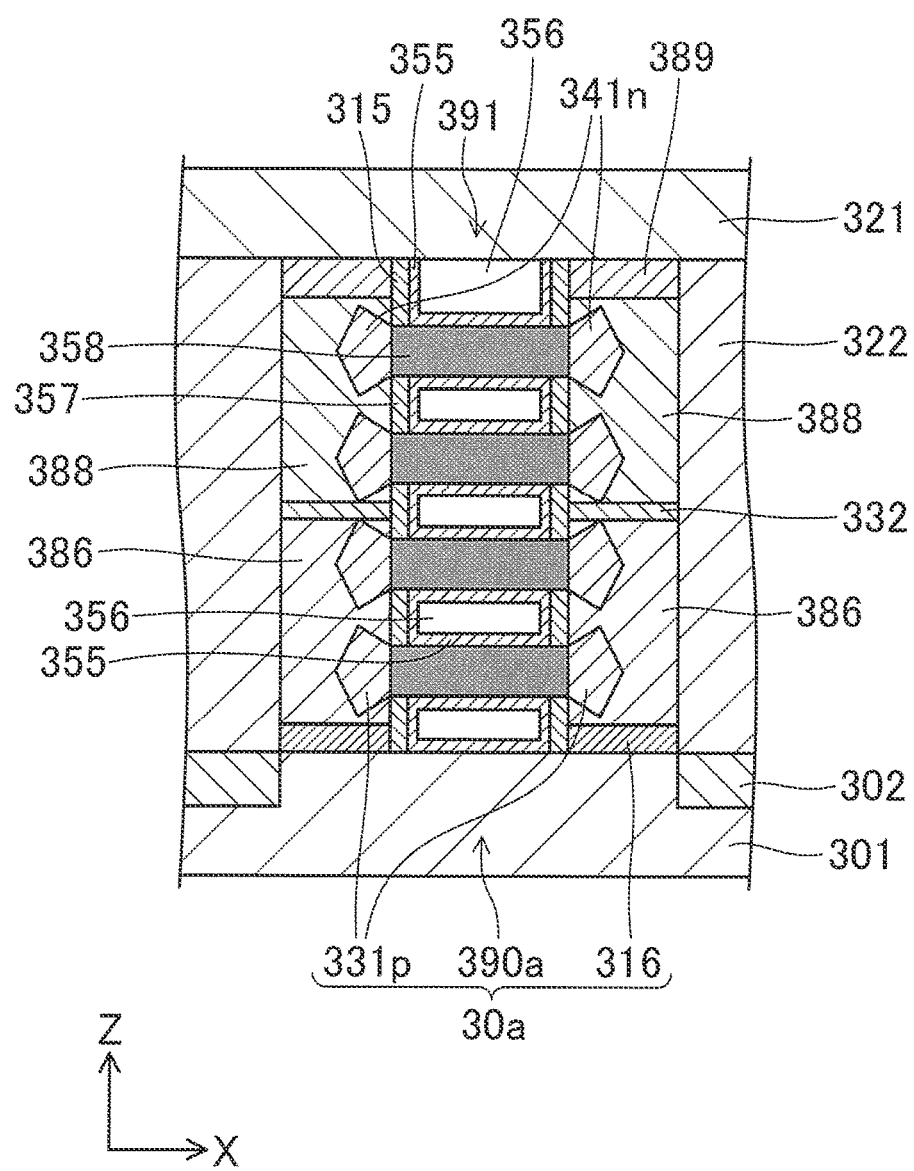
FIG. 17 is a cross-sectional view showing a structure of a semiconductor device provided with a CFET.
Figure 18:
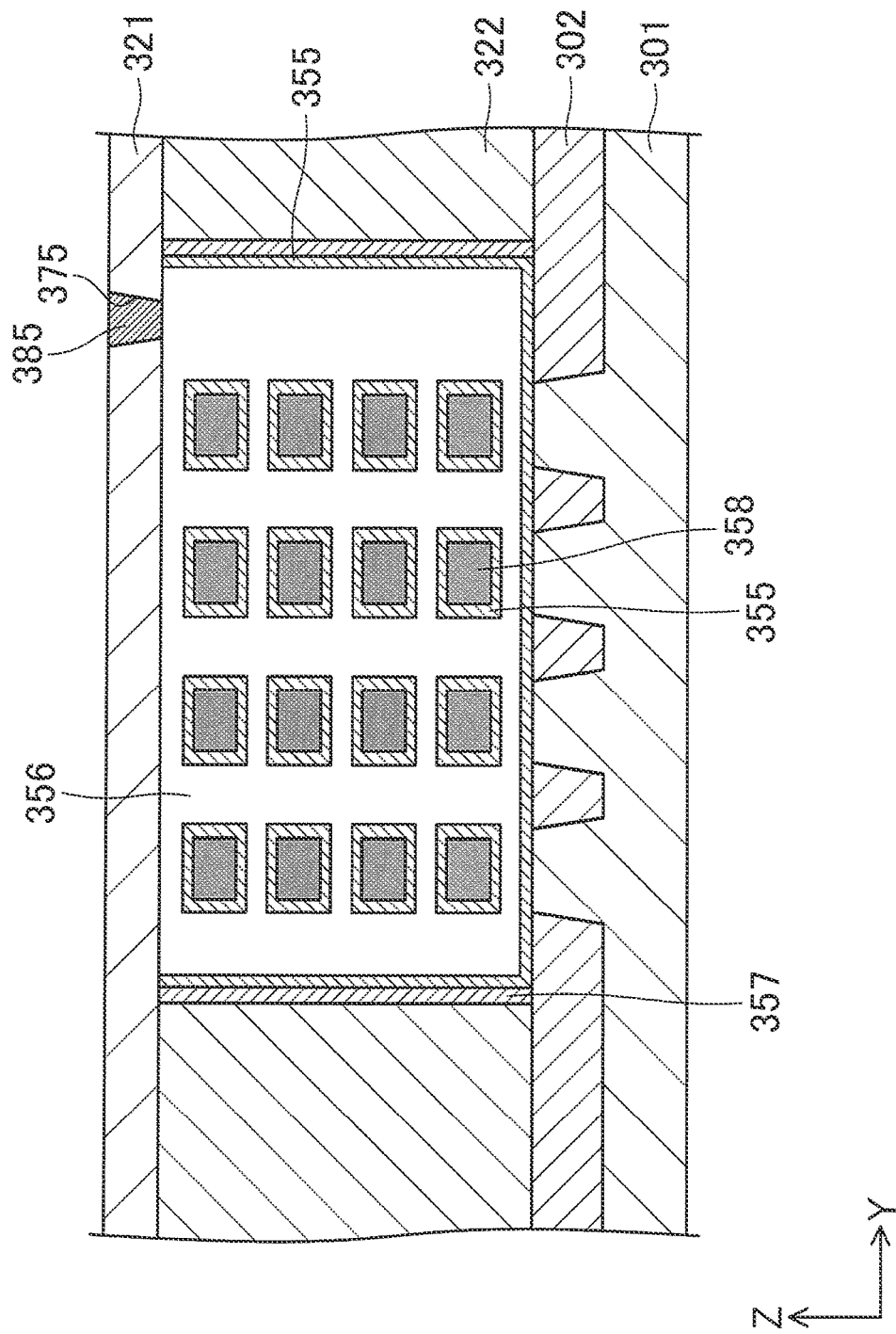
FIG. 18 is a cross-sectional view showing the structure of the semiconductor device provided with a CFET.
Figure 19:
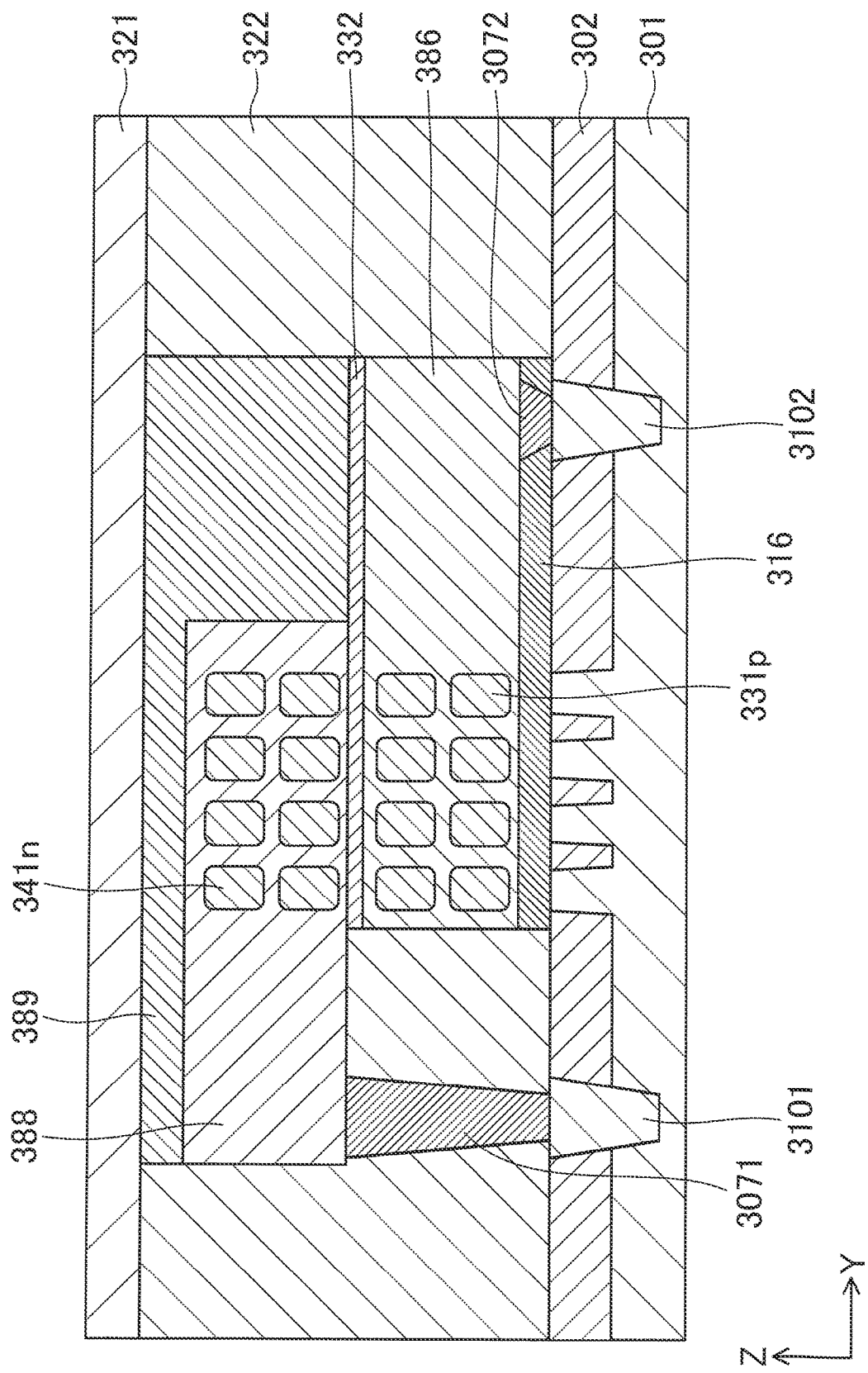
FIG. 19 is a cross-sectional view showing the structure of the semiconductor device provided with a CFET.
Figure 20:
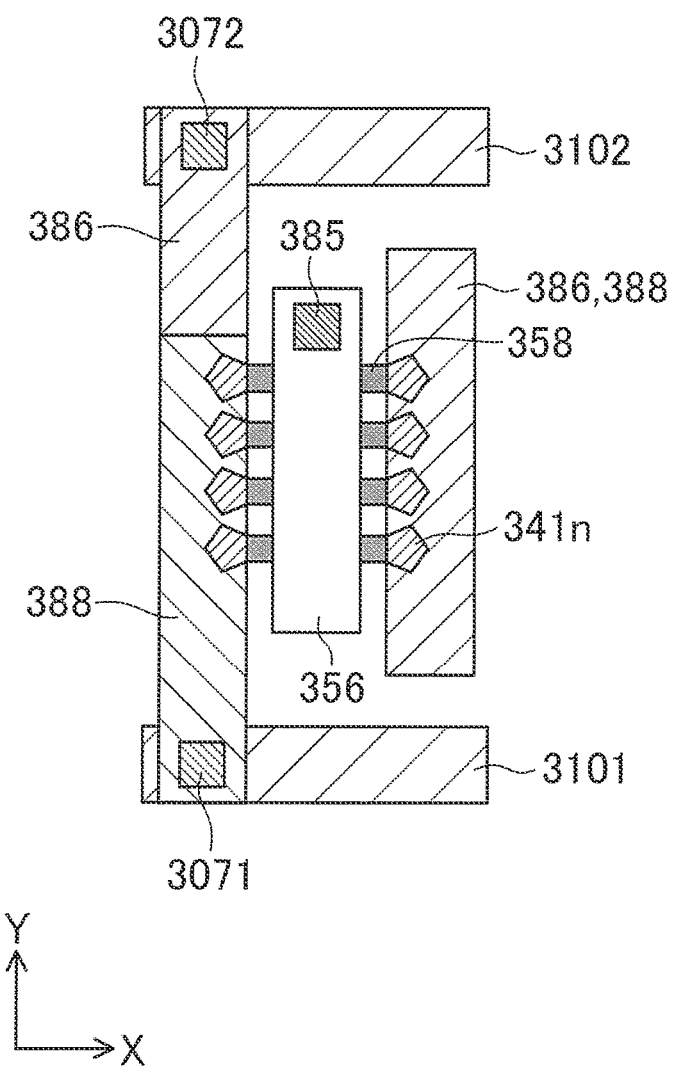
FIG. 20 is a plan view showing the structure of the semiconductor device provided with a CFET.

First, the basic structure of the CFET will be described. FIGS. 17 to 20 are views showing a structure of a semiconductor device provided with a CFET, where FIG. 17 is a cross-sectional view taken in an X direction, FIG. 18 is a cross-sectional view of a gate portion taken in a Y direction, FIG. 19 is a cross-sectional view of a source/drain portion taken in the Y direction, and FIG. 20 is a plan view. Note that the X direction refers to the direction in which nanowires extend, the Y direction refers to the direction in which a gate extends, and a Z direction refers to the direction vertical to the substrate plane. Note also that FIGS. 17 to 20 are schematic views in which the dimensions and positions of the components are not necessarily consistent with one another.

In this semiconductor device, an element isolation region 302 is formed on a semiconductor substrate 301 such as a silicon (Si) substrate, and an element active region 30a is defined by the element isolation region 302. In the element active region 30a, an n-type FET is formed above a p-type FET.

In the element active region 30a, a stacked transistor structure 390a is formed on the semiconductor substrate 301. The stacked transistor structure 390a includes a gate structure 391 formed on the semiconductor substrate 301. The gate structure 391 includes a gate electrode 356, a plurality of nanowires 358, gate insulating films 355, and an insulating film 357. The gate electrode 356 extends in the Y direction and stands in the Z direction. The nanowires 358 extend through the gate electrode 356 in the X direction, and are arranged in the Y and Z directions. The gate insulating films 355 are formed between the gate electrode 356 and the nanowires 358. The gate electrode 356 and the gate insulating films 355 extend only up to positions receding from both ends of the nanowires 358 in the X direction, and the insulating film 357 is formed to fill the resultant recesses. An insulating film 316 is formed on the semiconductor substrate 301 to lie on both sides of the insulating film 357. The reference numerals 321 and 322 denote inter-layer insulating films.

As shown in FIG. 18, the gate electrode 356 is connected to an interconnect in an upper layer through a via 385 formed in an opening 375.

For the gate electrode 356, titanium, a titanium nitride, or polysilicon, for example, can be used. For the gate insulating films 355, a high dielectric constant material such as a hafnium oxide, an aluminum oxide, or an oxide of hafnium and aluminum, for example, can be used. For the nanowires 358, silicon, for example, can be used. For the insulating film 316 and the insulating film 357, a silicon oxide or a silicon nitride, for example, can be used.

In this semiconductor device, the number of nanowires 358 arranged in the Z direction is four. In the element active region 30a, p-type semiconductor layers 331p are formed at both ends of two nanowires 358 closer to the semiconductor substrate 301. Two local interconnects 386 in contact with the p-type semiconductor layers 331p are formed to sandwich the gate structure 391 in the X direction. Also, n-type semiconductor layers 341n are formed at both ends of two nanowires 358 apart from the semiconductor substrate 301. Two local interconnects 388 in contact with the n-type semiconductor layers 341n are formed to sandwich the gate structure 391 in the X direction. An insulating film 332 is formed between the local interconnects 386 and the local interconnects 388. An insulating film 389 is formed on the local interconnects 388. The p-type semiconductor layers 331p are p-type SiGe layers, and the n-type semiconductor layers 341n are n-type Si layers, for example. For the insulating film 332, a silicon oxide or a silicon nitride, for example, can be used.

Also, as shown in FIG. 19, the local interconnect 388 is connected with a buried interconnect 3101 through a via 3071, and the local interconnect 386 is connected with a buried interconnect 3102 through a via 3072.

As described above, the stacked transistor structure 390a has a p-type FET including the gate electrode 356, nanowires 358, gate insulating films 355, and the p-type semiconductor layers 331p. In the p-type FET, ones of the p-type semiconductor layers 331p on one side function as source regions, the other p-type semiconductor layers 331p on the other side function as drain regions, and the nanowires 358 function as channels. The stacked transistor structure 390a also has an n-type FET including the gate electrode 356, nanowires 358, gate insulating films 355, and the n-type semiconductor layers 341n. In the n-type FET, ones of the n-type semiconductor layers 341n on one side function as source regions, the other n-type semiconductor layers 341n on the other side function as drain regions, and the nanowires 358 function as channels.

Note that layers above the stacked transistor structure are used for wiring between transistors through vias and metal interconnects, which can be implemented by known wiring processes.

While the number of nanowires in each of the p-type FET and the n-type FET is four in the Y direction and two in the Z direction, i.e., eight in total, it is not limited to this. Also, the numbers of nanowires in the p-type FET and the n-type FET may be different from each other.

As used herein, a semiconductor layer portion formed on each end of a nanowire to constitute a terminal that is to be the source or drain of a transistor is called a "pad." In the illustrated example of the basic structure of the CFET, the p-type semiconductor layers 331p and then-type semiconductor layers 341n correspond to pads.

Note that, in the plan views and cross-sectional views in the following embodiments, illustration of various insulating films may be omitted in some cases. Also, nanowires and pads at both ends of the nanowires may be illustrated in simplified linear shapes in some cases. Also, as used herein, an expression indicating that sizes, etc. are identical, such as the "same size," is to be understood as including a range of manufacturing variations.

As used herein, the source and drain of a transistor are called the "nodes" of the transistor as appropriate. That is, "one of the nodes of a transistor" refers to the source or drain of the transistor, and "both nodes of a transistor" refers to the source and drain of the transistor.

In the following description, while the basic structure is stacking of a p-type FET and an n-type FET one upon the other, there is a portion where a p-type FET or an n-type FET is formed in only the upper (or lower) layer. Such a portion is formed in the following manner, for example. After formation of upper- (or lower-) layer devices, the upper- (or lower-) layer devices are partly removed (e.g., removal of pad portions, or removal of gate interconnects and pad portions), whereby a p-type FET or an n-type FET can be formed in only the upper (or lower) layer. Alternatively, during formation of pad portions of upper- (or lower-) layer devices by epitaxial growth, part of the upper (or lower) layer may not be formed, whereby a p-type FET or an n-type FET can be formed in only the upper (or lower) layer.

Also, in the following description, while the basic structure is stacking of a p-type FET and an n-type FET one upon the other, there is a portion where FETs of the same conductivity type (p-type FETs or n-type FETs) are stacked one upon the other as the upper and lower layers. In other words, a FET of a different conductivity type may be formed in at least one of the upper and lower layers. Such a portion is formed in the following manner, for example. In the case of forming an n-type FET (or a p-type FET) in a portion of the upper (or lower) layer, the portion for forming an n-type FET (or a p-type FET) is masked to dope the other portion into p-type (or n-type) conductivity. Thereafter, the other portion is masked to dope the portion for forming an n-type FET (or a p-type FET) into n-type (or p-type) conductivity. In this way, since a FET of a different conductivity type can be formed in at least one of the upper and lower layers, it is possible to stack FETs of the same conductivity type one upon the other without fail.

In the following embodiments, "VDD" and "VSS" are used for indicating the voltages or the power supplies themselves.

In the following embodiments and their alterations, like components are denoted by the same reference characters, and the description thereof may be omitted.

First Embodiment

Figure 1:
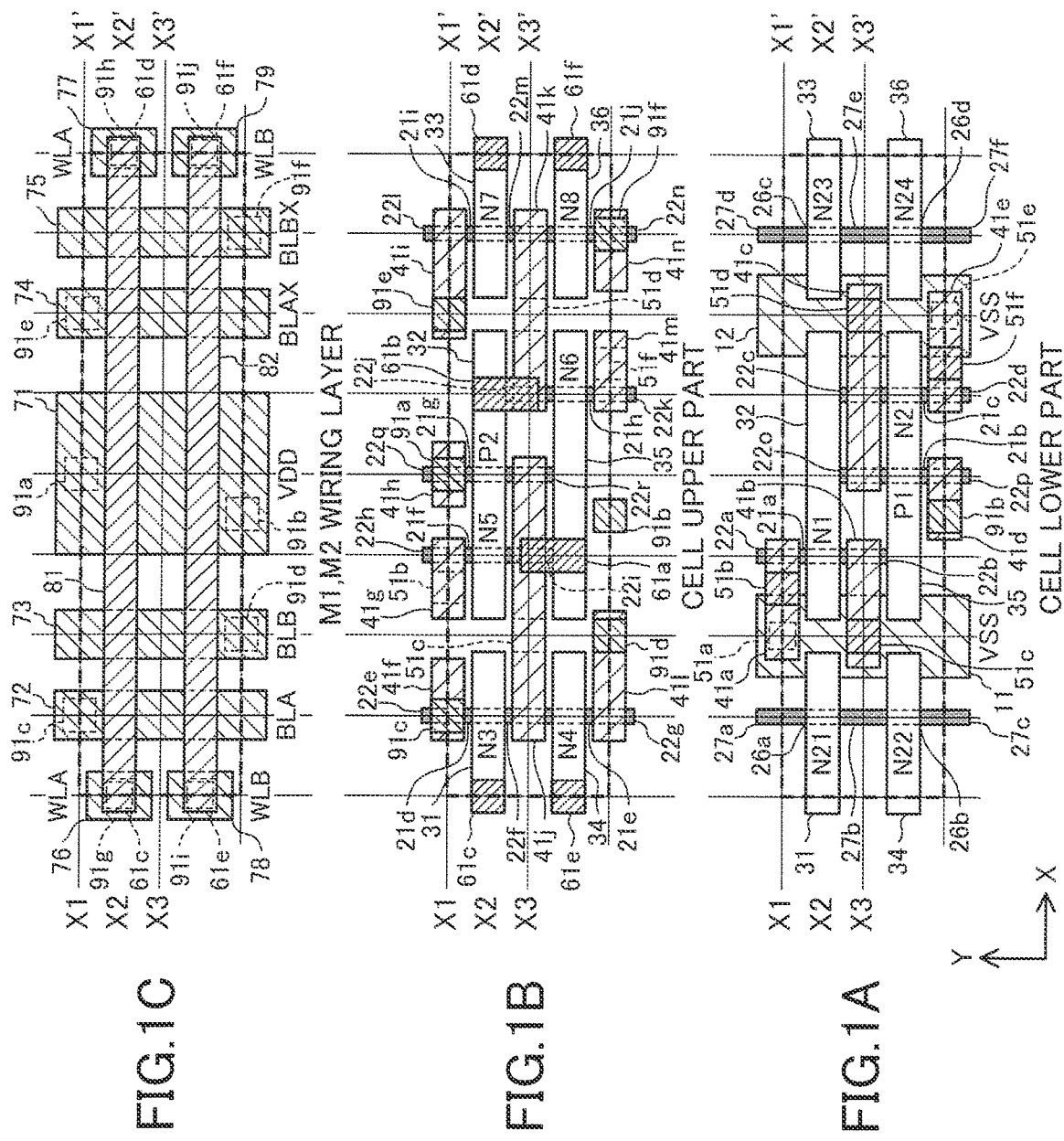
FIGS. 1A-1C are plan views showing an example of a layout structure of a two-port SRAM cell according to the first embodiment.
Figure 2:
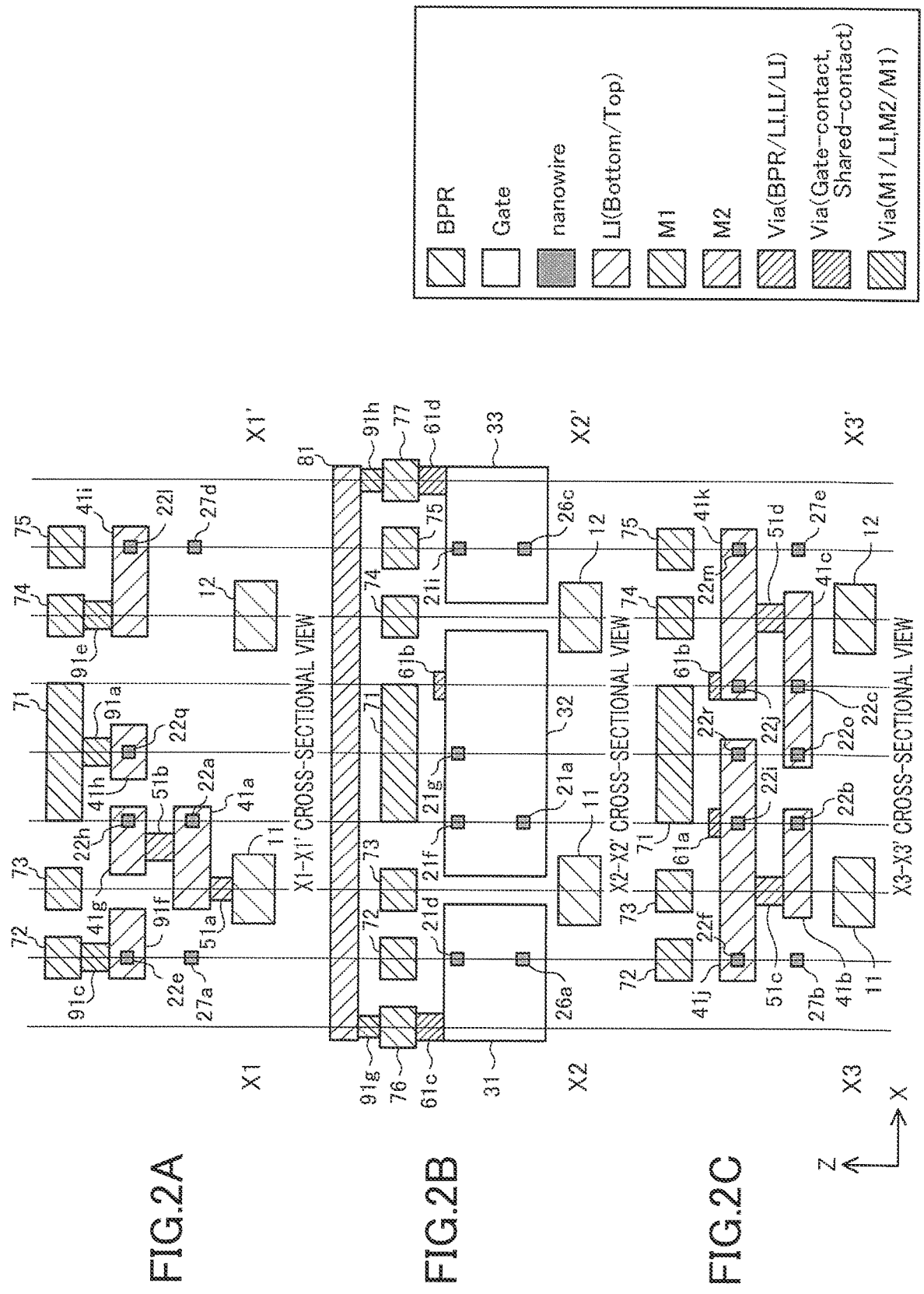
FIGS. 2A-2C are cross-sectional views of the layout structure of the two-port SRAM cell according to the first embodiment.

FIGS. 1A-1C and 2A-2C are views showing an example of a layout structure of a two-port SRAM cell according to the first embodiment, where FIGS. 1A-1C are plan views and FIGS. 2A-2C are cross-sectional views taken horizontally as viewed in plan. Specifically, FIG. 1A shows a lower part, i.e., a portion including three-dimensional transistors formed closer to a substrate, FIG. 1B shows an upper part, i.e., a portion including three-dimensional transistors formed away from the substrate, and FIG. 1C shows M1 and M2 layers that are metal wiring layers. FIG. 2A shows a cross section taken along line X1-X1', FIG. 2B shows a cross section taken along line X2-X2', and FIG. 2C shows a cross section taken along line X3-X3'.

Figure 3:
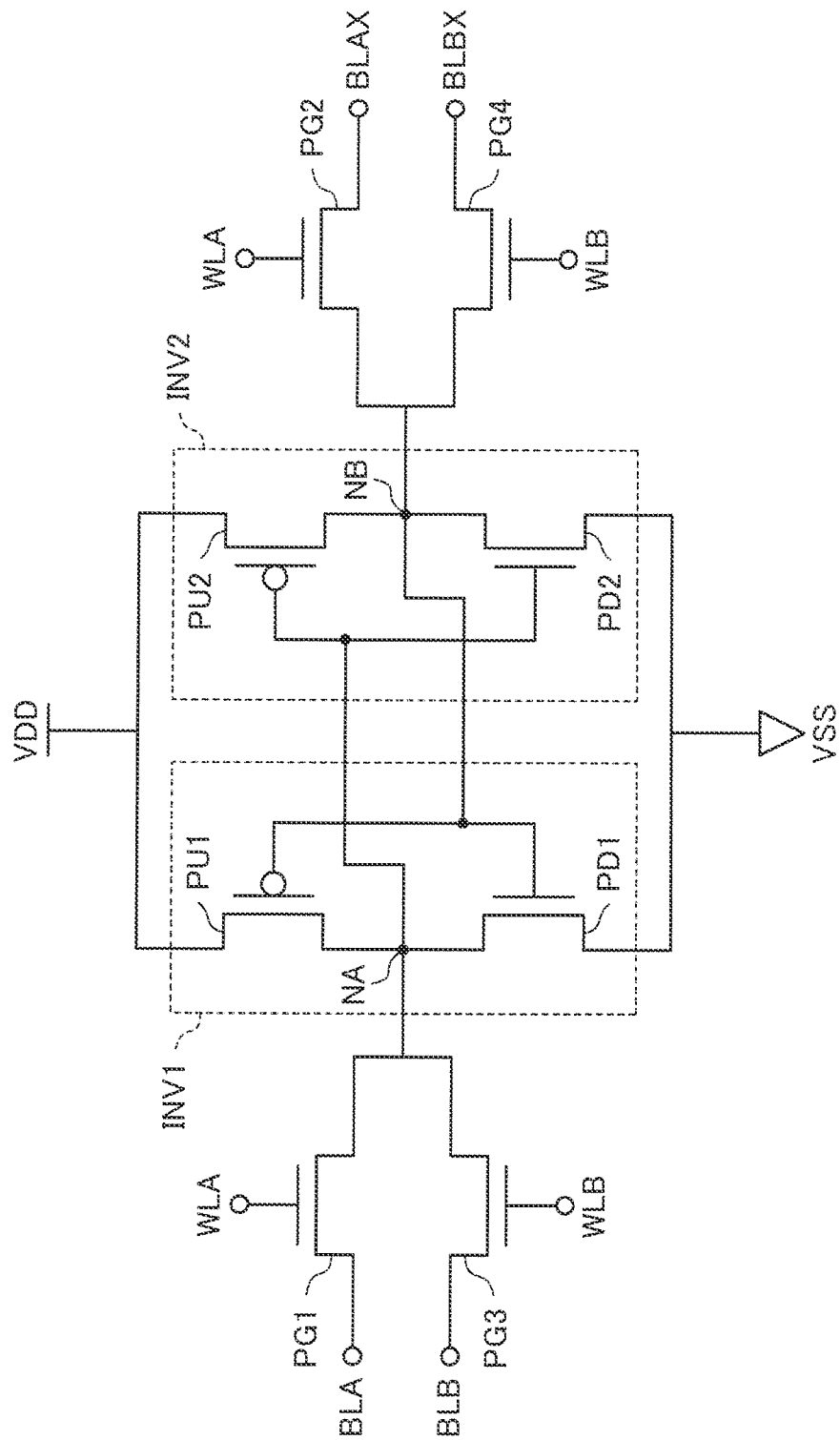
FIG. 3 is a circuit diagram showing a configuration of the two-port SRAM cell according to the first embodiment.

FIG. 3 is a circuit diagram showing a configuration of the two-port SRAM cell according to the first embodiment. As shown in FIG. 3, the two-port SRAM cell of this embodiment constitutes a two-port SRAM circuit made up of load transistors PU1 and PU2, drive transistors PD1 and PD2, and access transistors PG1 to PG4. The load transistors PU1 and PU2 are p-type FETs, and the drive transistors PD1 and PD2 and the access transistors PG1 to PG4 are n-type transistors.

The load transistor PU1 is provided between the power supply VDD and a first node NA, and the drive transistor PD1 is provided between the first node NA and the power supply VSS. The load transistor PU1 and the drive transistor PD1, the gates of which are connected to a second node NB, constitute an inverter INV1. The load transistor PU2 is provided between the power supply VDD and the second node NB, and the drive transistor PD2 is provided between the second node NB and the power supply VSS. The load transistor PU2 and the drive transistor PD2, the gates of which are connected to the first node NA, constitute an inverter INV2. That is, the output of one inverter is connected to the input of the other inverter, thereby constituting a latch.

The access transistor PG1 is provided between a first bit line BLA and the first node NA, and the gate thereof is connected to a first word line WLA. The access transistor PG2 is provided between a second bit line BLAX and the second node NB, and the gate thereof is connected to the first word line WLA. The access transistor PG3 is provided between a third bit line BLB and the first node NA, and the gate thereof is connected to a second word line WLB. The access transistor PG4 is provided between a fourth bit line BLBX and the second node NB, and the gate thereof is connected to the second word line WLB. The first and second bit lines BLA and BLAX constitute a first complementary bit line pair, and the third and fourth bit lines BLB and BLBX constitute a second complementary bit line pair.

In the two-port SRAM circuit, when the first and second bit lines BLA and BLAX constituting the first complementary bit line pair are driven to HIGH level and LOW level, respectively, and the first word line WLA is driven to HIGH level, HIGH level is written into the first node NA and LOW level is written into the second node NB. On the other hand, when the first and second bit lines BLA and BLAX are driven to LOW level and HIGH level, respectively, and the first word line WLA is driven to HIGH level, LOW level is written into the first node NA and HIGH level is written into the second node NB. In this state of the first and second nodes NA and NB having written data, when the first word line WLA is driven to LOW level, a latched state is established, whereby the data written in the first and second nodes NA and NB are retained.

Also, when the first and second bit lines BLA and BLAX are precharged to HIGH level, and then the first word line WLA is driven to HIGH level, the states of the first and second bit lines BLA and BLAX are determined according to the data written in the first and second nodes NA and NB. This permits read of data from the SRAM cell. To state specifically, when the first node NA is HIGH and the second node NB is LOW, the first bit line BLA keeps HIGH level, and the second bit line BLAX is discharged to LOW level. On the other hand, when the first node NA is LOW and the second node NB is HIGH, the first bit line BLA is discharged to LOW level, and the second bit line BLAX keeps HIGH level.

Likewise, when the third and fourth bit lines BLB and BLBX constituting the second complementary bit line pair are driven to HIGH level and LOW level, respectively, and the second word line WLB is driven to HIGH level, HIGH level is written into the first node NA and LOW level is written into the second node NB. On the other hand, when the third and fourth bit lines BLB and BLBX are driven to LOW level and HIGH level, respectively, and the second word line WLB is driven to HIGH level, LOW level is written into the first node NA and HIGH level is written into the second node NB. In this state of the first and second nodes NA and NB having written data, when the second word line WLB is driven to LOW level, a latched state is established, whereby the data written in the first and second nodes NA and NB are retained.

Also, when the third and fourth bit lines BLB and BLBX are precharged to HIGH level, and then the second word line WLB is driven to HIGH level, the states of the third and fourth bit lines BLB and BLBX are determined according to the data written in the first and second nodes NA and NB. This permits read of data from the SRAM cell. To state specifically, when the first node NA is HIGH and the second node NB is LOW, the third bit line BLB keeps HIGH level, and the fourth bit line BLBX is discharged to LOW level. On the other hand, when the first node NA is LOW and the second node NB is HIGH, the third bit line BLB is discharged to LOW level, and the fourth bit line BLBX keeps HIGH level.

As described above, the two-port SRAM cell is provided with the functions of data write into the SRAM cell, data retention, and data read from the SRAM cell by controlling the first and second bit lines BLA and BLAX and the first word line WLA. Also, the two-port SRAM cell is provided with the functions of data write into the SRAM cell, data retention, and data read from the SRAM cell by controlling the third and fourth bit lines BLB and BLBX and the second word line WLB.

In the following description, in the plan views such as FIGS. 1A-1C, the horizontal direction in the figure is called an X direction, the vertical direction in the figure is called a Y direction, and the direction vertical to the substrate plane is called the Z direction. Also, the solid lines running horizontally and vertically in the plan views such as FIGS. 1A-1C and the solid lines running vertically in the cross-sectional views such as FIGS. 2A-2C represent grid lines used for placement of components at the time of designing. The grid lines are placed at equal spacing in the X direction and placed at equal spacing in the Y direction. The grid spacings in the X and Y directions may be the same, or different from each other. Also, the grid spacings may be different between layers. Further, the components are not necessarily required to lie on grid lines. It is however preferable to place the components on grid lines from the standpoint of reducing manufacturing variations.

The dashed line drawn to surround a cell in the plan views such as FIGS. 1A-1C defines the bounds of the two-port SRAM cell (the outer rim of the two-port SRAM cell). The two-port SRAM cell is placed so that its rim touches the rim of a cell adjacent in the X direction or the Y direction.

As shown in FIG. 1A, in the cell lower part, power supply lines 11 and 12 extending in the Y direction are formed. The power supply lines 11 and 12 are both buried power rails (BPRs) formed in a buried wiring layer, and supply the voltage VSS. Note that in FIGS. 1A-1C, transistors P1 and P2 correspond to the load transistors PU2 and PU1, respectively, transistors N1 and N5 correspond to the drive transistor PD1, transistors N2 and N6 correspond to the drive transistor PD2, and transistors N3, N4, N7, and N8 correspond to the access transistors PG1, PG3, PG2, and PG4, respectively.

Nanowires 21a to 21c and 26a to 26d extending in the Y direction are formed in the cell lower part, and nanowires 21d to 21j extending in the Y direction are formed in the cell upper part.

The nanowires 21a, 26a, and 26c are formed side by side in the X direction, and the nanowires 21b, 21c, 26b, and 26d are formed side by side in the X direction. The nanowires 21d, 21f, 21g, and 21i are formed side by side in the X direction, and the nanowires 21e, 21h, and 21j are formed side by side in the X direction.

Also, the nanowires 21d, 21i, 26a, and 26c are formed in line with the nanowires 21e, 21j, 26b, and 26d, respectively, in the Y direction. The nanowires 21b and 21g are formed at the same position in the X direction as viewed in plan.

The nanowires 21a, 21c, and 26a to 26d overlap the nanowires 21f, 21h, 21d, 21e, 21i, and 21j, respectively, as viewed in plan.

Gate interconnects (gates) 31 to 36 extend in the Z direction over the cell lower and upper parts and also extend in the X direction. The gate interconnects 31 to 33 are formed in line in the X direction, and the gate interconnects 34 to 36 are formed in line in the X direction. The gate interconnect 31 is to be the gates of the transistor N3 and a dummy transistor N21, the gate interconnect 32 is to be the gates of the transistors N1, N5, and P2, and the gate interconnect 33 is to be the gates of the transistor N7 and a dummy transistor N23. The gate interconnect 34 is to be the gates of the transistor N4 and a dummy transistor N22, the gate interconnect 35 is to be the gates of the transistors N2, N6, and P1, and the gate interconnect 36 is to be the gates of the transistor N8 and a dummy transistor N24.

Pads 22a to 22n doped with an n-type semiconductor are formed at the upper end of the nanowire 21a, at the lower end of the nanowire 21a, at the upper end of the nanowire 21c, at the lower end of the nanowire 21c, at the upper end of the nanowire 21d, between the nanowires 21d and 21e, at the lower end of the nanowire 21e, at the upper end of the nanowire 21f, at the lower end of the nanowire 21f, at the upper end of the nanowire 21h, at the lower end of the nanowire 21h, at the upper end of the nanowire 21i, between the nanowires 21i and 21j, and at the lower end of the nanowire 21j, respectively, as viewed in the figure. The nanowires 21a, 21c, 21d to 21f, and 21h to 21j constitute the channel portions of the transistors N1 to N8, respectively. The pads 22a and 22b constitute the nodes of the transistor N1. The pads 22c and 22d constitute the nodes of the transistor N2. The pads 22e and 22f constitute the nodes of the transistor N3. The pads 22f and 22g constitute the nodes of the transistor N4. The pads 22h and 22i constitute the nodes of the transistor N5. The pads 22j and 22k constitute the nodes of the transistor N6. The pads 22l and 22m constitute the nodes of the transistor N7. The pads 22m and 22n constitute the nodes of the transistor N8.

That is, the transistor N1 is constituted by the nanowire 21a, the gate interconnect 32, and the pads 22a and 22b. The transistor N2 is constituted by the nanowire 21c, the gate interconnect 35, and the pads 22c and 22d. The transistor N3 is constituted by the nanowire 21d, the gate interconnect 31, and the pads 22e and 22f. The transistor N4 is constituted by the nanowire 21e, the gate interconnect 34, and the pads 22f and 22g. The transistor N5 is constituted by the nanowire 21f, the gate interconnect 32, and the pads 22h and 22i. The transistor N6 is constituted by the nanowire 21h, the gate interconnect 35, and the pads 22j and 22k. The transistor N7 is constituted by the nanowire 21i, the gate interconnect 33, and the pads 22l and 22m. The transistor N8 is constituted by the nanowire 21j, the gate interconnect 36, and the pads 22m and 22n.

Pads 22o to 22r doped with a p-type semiconductor are formed at the upper end of the nanowire 21b, at the lower end of the nanowire 21b, at the upper end of the nanowire 21g, and at the lower end of the nanowire 21g, respectively, as viewed in the figure. The nanowires 21b and 21g constitute the channel portions of the transistors P1 and P2, respectively. The pads 22o and 22p constitute the nodes of the transistor P1, and the pads 22q and 22r constitute the nodes of the transistor P2.

That is, the transistor P1 is constituted by the nanowire 21b, the gate interconnect 35, and the pads 22o and 22p. The transistor P2 is constituted by the nanowire 21g, the gate interconnect 32, and the pads 22q and 22r.

Dummy pads 27a to 27f doped with an n-type semiconductor are formed at the upper end of the nanowire 26a, between the nanowires 26a and 26b, at the lower end of the nanowire 26b, at the upper end of the nanowire 26c, between the nanowires 26c and 26d, and at the lower end of the nanowire 26d, respectively, as viewed in the figure. The dummy pads 27a and 27b constitute the nodes of the dummy transistor N21. The dummy pads 27b and 27c constitute the nodes of the dummy transistor N22. The dummy pads 27d and 27e constitute the nodes of the dummy transistor N23. The dummy pads 27e and 27f constitute the nodes of the dummy transistor N24. The nanowires 26a to 26d correspond to the channel portions of the dummy transistors N21 to N24.

Note that the dummy transistors N21 to N24 are transistors having no logical functions. In the circuit diagram of FIG. 3, illustration of the dummy transistors N21 to N24 is omitted. While some of two-port SRAM cells in the subsequent embodiments and alterations include dummy transistors, illustration of such dummy transistors is omitted in the circuit diagram since they have no influence on the logical functions of the two-port SRAM cells.

Thus, in the two-port SRAM cell according to this embodiment, the transistors N3 to N8 overlap the dummy transistors N21 and N22, the transistors N1 and N2, and the dummy transistors N23 and N24, respectively, as viewed in plan.

The transistor N1 and the dummy transistors N21 and N23 are formed side by side in the X direction, and the transistors N2 and P1 and the dummy transistors N22 and N24 are formed side by side in the X direction. The transistors N3, N5, N7, and P2 are formed side by side in the X direction, and the transistors N4, N6, and N8 are formed side by side in the X direction.

The transistors N3 and N7 and the dummy transistors N21 and N23 are formed in line with the transistors N4 and N8 and the dummy transistors N22 and N24, respectively, in the Y direction. The transistors P1 and P2 are formed at the same position in the X direction as viewed in plan.

In the cell lower part, local interconnects (LI) 41a to 41e extending in the X direction are formed. The local interconnect 41a is connected with the pad 22a, the local interconnect 41b is connected with the pad 22b, the local interconnect 41c is connected with the pads 22c and 22o, the local interconnect 41d is connected with the pad 22p, and the local interconnect 41e is connected with the pad 22d.

In the cell upper part, local interconnects 41f to 41n extending in the X direction are formed. The local interconnect 41f is connected with the pad 22e, the local interconnect 41g is connected with the pad 22h, the local interconnect 41h is connected with the pad 22q, the local interconnect 41i is connected with the pad 22l, the local interconnect 41j is connected with the pads 22f, 22i, and 22r, the local interconnect 41k is connected with the pads 22j and 22m, the local interconnect 41l is connected with the pad 22g, the local interconnect 41m is connected with the pad 22k, and the local interconnect 41n is connected with the pad 22n.

The local interconnect 41a is connected with the power supply line 11 through a contact (via) 51a and connected with the local interconnect 41g through a contact 51b. The local interconnect 41b is connected with the local interconnect 41j through a contact 51c. The local interconnect 41c is connected with the local interconnect 41k through a contact 51d. The local interconnect 41e is connected with the power supply line 12 through a contact 51e, and connected with the local interconnect 41m through a contact 51f. The local interconnect 41j is connected with the gate interconnect 35 through a shared contact 61a. The local interconnect 41k is connected with the gate interconnect 32 through a shared contact 61b.

That is, the transistors N1 and N5 have their respective pads mutually connected through local interconnects and contacts, and share the gate interconnect. Also, the transistors N2 and N6 have their respective pads mutually connected through local interconnects and contacts, and share the gate interconnect. The transistors N1 and N5 correspond to the drive transistor PD1, and the transistors N2 and N6 correspond to the drive transistor PD2. Therefore, in the two-port SRAM cell according to this embodiment, the drive transistors PD1 and PD2 are each constituted by two parallel-connected n-type FETs.

The local interconnects 41b and 41j, the contact 51c, the shared contact 61a, and the gate interconnect 35 correspond to the first node NA, and the local interconnects 41c and 41k, the contact 51d, the shared contact 61b, and the gate interconnect 32 correspond to the second node NB.

As shown in FIG. 1C, interconnects 71 to 75 extending in the Y direction from end to end of the cell are formed in an M1 wiring layer that is a metal wiring layer. Interconnects 76 to 79 are also formed. The interconnect 71 supplies the voltage VDD, and the interconnects 72 to 75 correspond to the first bit line BLA, the third bit line BLB, the second bit line BLAX, and the fourth bit line BLBX, respectively.

Interconnects 81 and 82 extending in the X direction from end to end of the cell are formed in an M2 wiring layer located above the M1 wiring layer. The interconnects 81 and 82 are placed side by side in the Y direction, and correspond to the first word line WLA and the second word line WLB, respectively.

The interconnect 71 is connected with the local interconnect 41h through a contact 91a and connected with the local interconnect 41d through a contact 91b. The interconnect 72 is connected with the local interconnect 41f through a contact 91c. The interconnect 73 is connected with the local interconnect 41l through a contact 91d. The interconnect 74 is connected with the local interconnect 41i through a contact 91e. The interconnect 75 is connected with the local interconnect 41n through a contact 91f.

The interconnect 76 is connected with the gate interconnect 31 through a contact (gate contact) 61c and connected with the interconnect 81 through a contact 91g. The interconnect 77 is connected with the gate interconnect 33 through a contact 61d and connected with the interconnect 81 through a contact 91h. The interconnect 78 is connected with the gate interconnect 34 through a contact 61e and connected with the interconnect 82 through a contact 91i. The interconnect 79 is connected with the gate interconnect 36 through a contact 61f and connected with the interconnect 82 through a contact 91j. That is, the interconnect 81 is connected with the gate interconnect 31 through the contact 91g, the interconnect 76, and the contact 61c, and connected with the gate interconnect 33 through the contact 91h, the interconnect 77, and the contact 61d. The interconnect 82 is connected with the gate interconnect 34 through the contact 91i, the interconnect 78, and the contact 61e, and connected with the gate interconnect 36 through the contact 91j, the interconnect 79, and the contact 61f.

With the above configuration, in the transistor P2 (load transistor PU1), the pad 22q is connected to the interconnect 71 that supplies the voltage VDD, the pad 22r is connected to the local interconnect 41j (first node NA), and the gate interconnect 32 is connected to the shared contact 61b (second node NB). In the transistor P1 (load transistor PU2), the pad 22p is connected to the interconnect 71 that supplies the voltage VDD, the pad 22o is connected to the local interconnect 41c (second node NA), and the gate interconnect 35 is connected to the shared contact 61a (first node NA). In the transistors N1 and N5 (load transistor PD1), the pads 22b and 22i are connected to the local interconnects 41b and 41j (first node NA), the pads 22a and 22h are connected to the power supply line 11 that supplies the voltage VSS, and the gate interconnect 32 is connected to the shared contact 61b (second node NB). In the transistors N2 and N6 (load transistor PD2), the pads 22c and 22j are connected to the local interconnects 41c and 41k (second node NB), the pads 22d and 22k are connected to the power supply line 12 that supplies the voltage VSS, and the gate interconnect 35 is connected to the shared contact 61a (first node NA). In the transistor N3 (access transistor PG1), the pad 22e is connected to the interconnect 72 (first bit line BLA), the pad 22f is connected to the local interconnect 41j (first node NA), and the gate interconnect 31 is connected to the interconnect 81 (first word line WLA). In the transistor N7 (access transistor PG2), the pad 22l is connected to the interconnect 74 (second bit line BLAX), the pad 22m is connected to the local interconnect 41k (second node NB), and the gate interconnect 33 is connected to the interconnect 81 (first word line WLA). In the transistor N4 (access transistor PG3), the pad 22g is connected to the interconnect 73 (third bit line BLB), the pad 22f is connected to the local interconnect 41j (first node NA), and the gate interconnect 34 is connected to the interconnect 82 (second word line WLB). In the transistor N8 (access transistor PG4), the pad 22n is connected to the interconnect 75 (fourth bit line BLBX), the pad 22m is connected to the local interconnect 41k (second node NB), and the gate interconnect 36 is connected to the interconnect 82 (second word line WLB). That is, the two-port SRAM circuit is made up of the transistors N1 to N8, P1, and P2. The transistors N1, N2, and P1 are formed in the cell lower part, and the transistors N3 to N8, and P2 are formed in the cell upper part. The transistors N1 to N8, P1, and P2 are all three-dimensional transistors. In this way, the two-port SRAM cell using CFETs can be implemented.

Also, the transistors P1 and P2 are formed at the same position in the X direction as viewed in plan. This makes it possible to reduce the area of the two-port SRAM cell.

The drive transistor PD1 is constituted by the parallel-connected transistors N1 and N5, and the drive transistor PD2 is constituted by the parallel-connected transistors N2 and N6. Also, the transistors N1 and N2 overlap the transistors N5 and N6, respectively, as viewed in plan. It is therefore possible to reduce the area of the two-port SRAM cell while improving the drive capability of the cell.

In placing a two-port SRAM cell adjacent to the existing one in the X direction, the cell may be inverted in the X direction or may not be inverted. In placing a two-port SRAM cell adjacent to the existing one in the Y direction, however, the cell should be inverted in the Y direction.

No local interconnect is connected to the nodes of the dummy transistors N21 to N24. The dummy transistors N21 to N24 therefore exert no influence on the logical functions of the two-port SRAM cell. Formation of the dummy transistors N21 to N24 is not necessarily required, but, by forming the dummy transistors N21 to N24, it is possible to reduce manufacturing variations, improve the yield, and improve the reliability.

The shared contact 61a for connecting the local interconnect 41j and the gate interconnect 35 and the shared contact 61b for connecting the local interconnect 41k and the gate interconnect 32 may be formed in the same process step as, or in a different process step from, the contacts 61c to 61f for connecting the interconnects placed in the M1 wiring layer and the gate interconnects.

While the interconnect 71 that supplies the voltage VDD is provided in the M1 wiring layer, an interconnect that supplies VDD may be provided in the buried wiring layer. Otherwise, an interconnect that supplies VDD may be provided in both the M1 wiring layer and the buried wiring layer. In this case, since the power supply of the voltage VDD is intensified, stabilization of the power supply can be achieved.

While the transistors N3, N4, N7 and N8 are formed in the cell upper part, they may be formed in the cell lower part. In this case, the transistors N3, N4, N7 and N8 are to be formed in place of the dummy transistors N21 to N24, and local interconnects and contacts are to be formed in the two-port SRAM cell so as to make up the above-described two-port SRAM circuit.

(Alteration 1)

Figure 4:
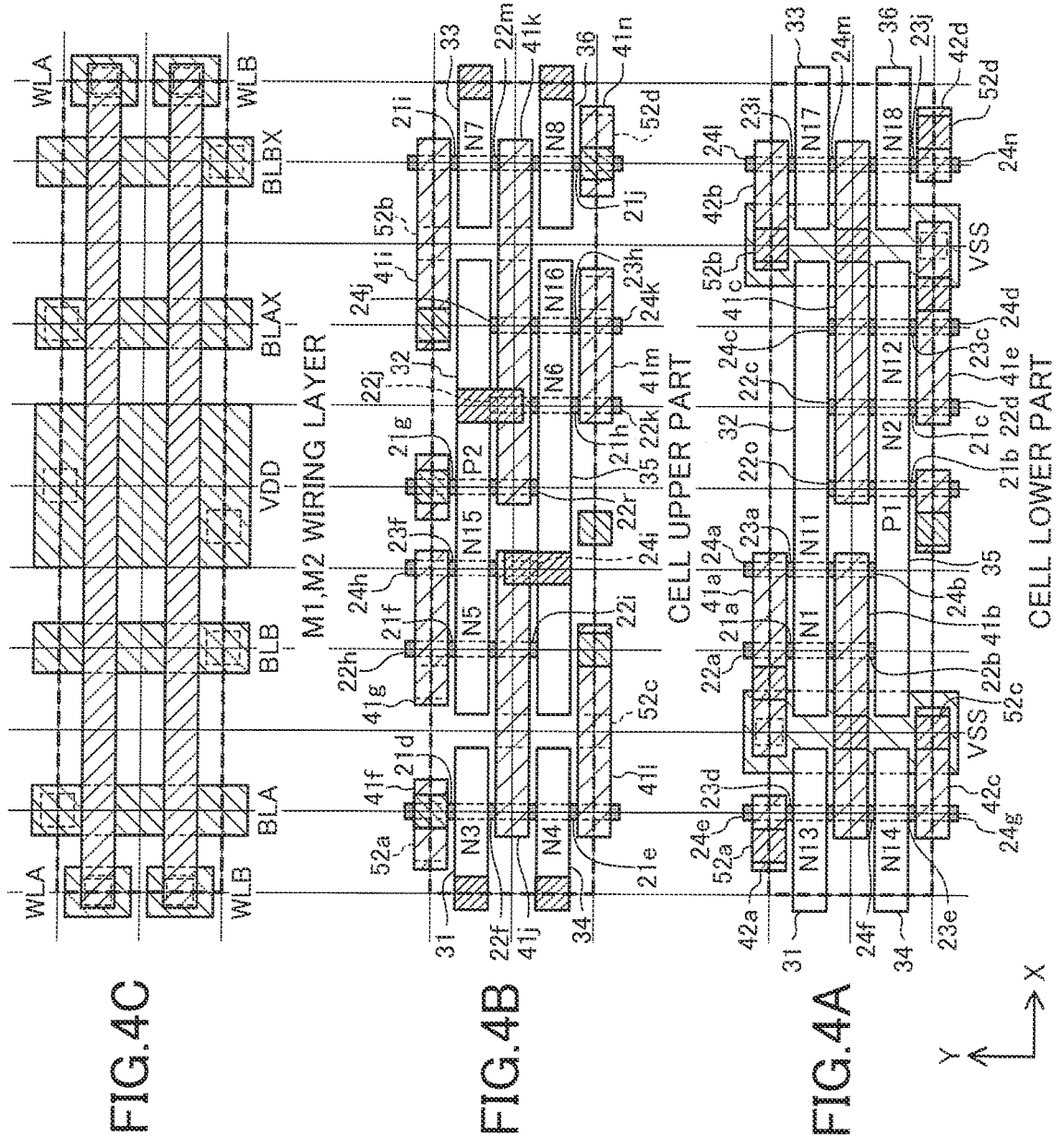
FIGS. 4A-4C are plan views showing another example of the layout structure of the two-port SRAM cell according to the first embodiment.

FIGS. 4A-4C are plan views showing another example of the layout structure of the two-port SRAM cell according to the first embodiment. Specifically, FIG. 4A shows a cell lower part, FIG. 4B shows a cell upper part, and FIG. 4C shows M1 and M2 layers. In FIGS. 4A-4C, in comparison with FIGS. 1A-1C, transistors N11 to N14, N17, and N18 are formed in the cell lower part, in addition to the transistors N1, N2, and P1, and the dummy transistors N21 to N24 are omitted. Also, transistors N15 and N16 are formed in the cell upper part, in addition to the transistors N3 to N8 and P2.

More specifically, nanowires 23a, 23c, 23d, 23e, 23i, and 23j extending in the Y direction are formed in the cell lower part, and nanowires 23f and 23h extending in the Y direction are formed in the cell upper part.

The nanowires 23a, 23d, and 23i are formed side by side with the nanowire 21a in the X direction. The nanowires 23c, 23e, and 23j are formed side by side with the nanowires 21b and 21c in the X direction. The nanowire 23f is formed side by side with the nanowires 21d, 21f, 21g, and 21i in the X direction. The nanowire 23h is formed side by side with the nanowires 21e, 21h, and 21j in the X direction.

The nanowires 23d and 23i are formed in line with the nanowires 23e and 23j, respectively, in the Y direction.

The nanowires 23a, 23c, 23d, 23e, 23i, and 23j overlap the nanowires 23f, 23h, 21d, 21e, 21i, and 21j, respectively, as viewed in plan.

The gate interconnect 31 is to be the gate of the transistor N13. The gate interconnect 32 is to be the gates of the transistors N11 and N15. The gate interconnect 33 is to be the gate of the transistor N17. The gate interconnect 34 is to be the gate of the transistor N14. The gate interconnect 35 is to be the gates of the transistors N12 and N16. The gate interconnect 36 is to be the gate of the transistor N18.

Pads 24a to 24n doped with an n-type semiconductor are formed at the upper end of the nanowire 23a, at the lower end of the nanowire 23a, at the upper end of the nanowire 23c, at the lower end of the nanowire 23c, at the upper end of the nanowire 23d, between the nanowires 23d and 23e, at the lower end of the nanowire 23e, at the upper end of the nanowire 23f, at the lower end of the nanowire 23f, at the upper end of the nanowire 23h, at the lower end of the nanowire 23h, at the upper end of the nanowire 23i, between the nanowires 23i and 23j, and at the lower end of the nanowire 23j, respectively, as viewed in the figure. The nanowires 23a, 23c, 23d, 23e, 23f, 23h, 23i, and 23j constitute the channel portions of the transistors N11 to N18, respectively. The pads 24a and 24b constitute the nodes of the transistor N11. The pads 24c and 24d constitute the nodes of the transistor N12. The pads 24e and 24f constitute the nodes of the transistor N13. The pads 24f and 24g constitute the nodes of the transistor N14. The pads 24h and 24i constitute the nodes of the transistor N15. The pads 24j and 24k constitute the nodes of the transistor N16. The pads 24l and 24m constitute the nodes of the transistor N17. The pads 24m and 24n constitute the nodes of the transistor N18.

That is, the transistor N11 is constituted by the nanowire 23a, the gate interconnect 32, and the pads 24a and 24b. The transistor N12 is constituted by the nanowire 23c, the gate interconnect 35, and the pads 24c and 24d. The transistor N13 is constituted by the nanowire 23d, the gate interconnect 31, and the pads 24e and 24f. The transistor N14 is constituted by the nanowire 23e, the gate interconnect 34, and the pads 24f and 24g. The transistor N15 is constituted by the nanowire 23f, the gate interconnect 32, and the pads 24h and 24i. The transistor N16 is constituted by the nanowire 23h, the gate interconnect 35, and the pads 24j and 24k. The transistor N17 is constituted by the nanowire 23i, the gate interconnect 33, and the pads 24l and 24m. The transistor N18 is constituted by the nanowire 23j, the gate interconnect 36, and the pads 24m and 24n.

Therefore, the transistors N11 to N14, N17, and N18 overlap the transistors N15, N16, N3, N4, N7, and N8, respectively, as viewed in plan.

The transistors N11, N13, and N17 are formed side by side with the transistor N1 in the X direction, and the transistors N12, N14, and N18 are formed side by side with the transistors N2 and P1 in the X direction. The transistor N15 is formed side by side with the transistors N3, N5, N7, and P2 in the X direction, and the transistor N16 is formed side by side with the transistors N4. N6, and N8 in the X direction.

Also, the transistors N13 and N17 are formed in line with the transistors N14 and N18, respectively, in the Y direction.

In the cell lower part, local interconnects 42a to 42d extending in the X direction are formed. The local interconnect 42a is connected with the pad 24e, the local interconnect 42b is connected with the pad 24l, the local interconnect 42c is connected with the pad 24g, and the local interconnect 42d is connected with the pad 24n.

In the cell lower part, also, the local interconnect 41a is connected with the pads 22a and 24a, the local interconnect 41b is connected with the pads 22b, 24b, and 24f, the local interconnect 41c is connected with the pads 22c, 22o, 24c, and 24m, and the local interconnect 41e is connected with the pads 22d and 24d.

In the cell upper part, the local interconnect 41g is connected with the pads 22h and 24h, the local interconnect 41j is connected with the pads 22f, 22i, and 24i, the local interconnect 41k is connected with the pads 22j, 22m, 22r, and 24j, and the local interconnect 41m is connected with the pads 22k and 24k.

The local interconnect 42a is connected with the local interconnect 41f through a contact 52a, the local interconnect 42b is connected with the local interconnect 41i through a contact 52b, the local interconnect 42c is connected with the local interconnect 41l through a contact 52c, and the local interconnect 42d is connected with the local interconnect 41n through a contact 52d.

That is, the transistors N1, N5, N11, and N15 are mutually connected at their pads through the local interconnects and the contacts, and share the gate interconnect. The transistors N2, N6, N12, and N16 are mutually connected at their pads through the local interconnects and the contacts, and share the gate interconnect. The transistors N3 and N13 are mutually connected at their pads through the local interconnects and the contacts, and share the gate interconnect. The transistors N4 and N14 are mutually connected at their pads through the local interconnects and the contacts, and share the gate interconnect. The transistors N7 and N17 are mutually connected at their pads through the local interconnects and the contacts, and share the gate interconnect. The transistors N8 and N18 are mutually connected at their pads through the local interconnects and the contacts, and share the gate interconnect. In this alteration, the transistors N1, N5, N11, and N15 correspond to the drive transistor PD1, and the transistors N2, N6, N12, and N16 correspond to the drive transistor PD2. The transistors N3 and N13 correspond to the access transistor PG1, the transistors N7 and N17 correspond to the access transistor PG2, the transistors N4 and N14 correspond to the access transistor PG3, and the transistors N8 and N18 correspond to the access transistor PG4.

Therefore, in this alteration, the drive transistors PD1 and PD2 are each constituted by four parallel-connected n-type FETs, and the access transistors PG1 to PG4 are each constituted by two parallel-connected n-type FETs. Also, the transistors corresponding to each of the drive transistors PD1 and PD2 and the access transistors PG1 to PG4 are stacked one upon the other. With this alteration, similar effects to those obtained in the two-port SRAM cell of the first embodiment can be obtained.

Also, the drive transistor PD1 is constituted by the parallel-connected transistors N1, N5, N11, and N15, the drive transistor PD2 is constituted by the parallel-connected transistors N2, N6, N12, and N16, the access transistor PG1 is constituted by the parallel-connected transistors N3 and N13, the access transistor PG2 is constituted by the parallel-connected transistors N7 and N17, the access transistor PG3 is constituted by the parallel-connected transistors N4 and N14, and the access transistor PG4 is constituted by the parallel-connected transistors N8 and N18. Also, the transistors N11 to N14, N17, and N18 overlap the transistors N15, N16, N3, N4, N7, and N8, respectively, as viewed in plan. It is therefore possible to reduce the area of the two-port SRAM cell while improving the drive capability of the cell.

(Alteration 2)

Figure 5:
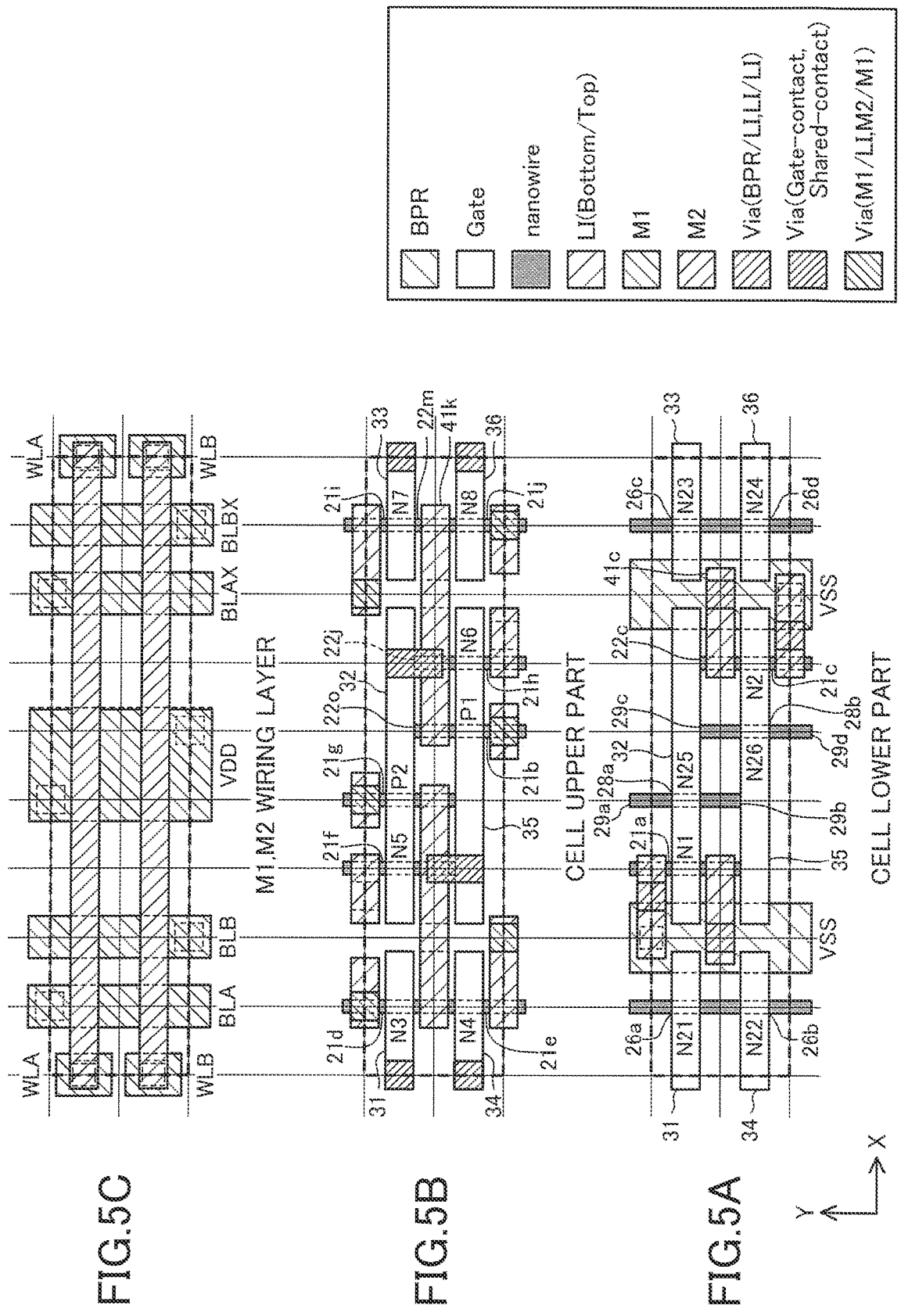
FIGS. 5A-5C are plan views showing yet another example of the layout structure of the two-port SRAM cell according to the first embodiment.

FIGS. 5A-5C are plan views showing yet another example of the layout structure of the two-port SRAM cell according to the first embodiment. Specifically, FIG. 5A shows a cell lower part, FIG. 5B shows a cell upper part, and FIG. 5C shows M1 and M2 layers. In FIGS. 5A-5C, in comparison with FIGS. 1A-1C, the transistor P1 is formed in the cell upper part, and dummy transistors N25 and N26 are formed in the cell lower part.

More specifically, the nanowire 21b is formed in the cell upper part, and nanowires 28a and 28b extending in the Y direction are formed in the cell lower part.

The nanowire 21b is formed side by side with the nanowires 21e, 21h, and 21j in the X direction. The nanowire 28a is formed side by side with the nanowires 21a, 26a, and 26c in the X direction, and the nanowire 28b is formed side by side with the nanowires 21c, 26b, and 26d in the X direction.

The nanowires 21g and 21b overlap the nanowires 28a and 28b, respectively, as viewed in plan.

Dummy pads 29a to 29d doped with an n-type semiconductor are formed at the upper end of the nanowire 28a, at the lower end of the nanowire 28a, at the upper end of the nanowire 28b, and at the lower end of the nanowire 28b, respectively, as viewed in the figure. The nanowires 28a and 28b constitute the channel portions of the dummy transistors N25 and N26, respectively. The dummy pads 29a and 29b constitute the nodes of the dummy transistor N25, and the dummy pads 29c and 29d constitute the nodes of the dummy transistor N26. Note that the dummy transistors N25 and N26 are transistors having no logical functions.

Therefore, the transistors P2 and P1 overlap the dummy transistors N25 and N26, respectively, as viewed in plan.

The transistor P1 is formed side by side with the transistors N4, N6, and N8 in the X direction. The dummy transistor N25 is formed side by side with the transistor N1 and the dummy transistors N21 and N23 in the X direction. The dummy transistor N26 is formed side by side with the transistor N2 and the dummy transistors N22 and N24 in the X direction.

In the cell lower part, the local interconnect 41c is connected with the pad 22c. In the cell upper part, the local interconnect 41k is connected with the pads 22o, 22j, and 22m.

In this alteration, the transistors including the dummy transistors are each stacked with another transistor. Also, the transistors including the dummy transistors formed in the cell lower part are only n-type FETs. With this alteration, similar effects to those obtained in the two-port SRAM cell of the first embodiment can be obtained.

Also, the transistors N3 to N8, P2, and P1 overlap the dummy transistors N21 and N22, the transistors N1 and N2, and the dummy transistors N23 to N26, respectively, as viewed in plan. That is, each of the transistors including the dummy transistors is in a stacked state with another transistor. Since this eliminates the necessity of doing work such as removal of some transistors, complication of the manufacturing process can be avoided.

The transistors N1 and N2 and the dummy transistors N21 to N26 are formed in the cell lower part and the transistors P1, P2, and N3 to N8 are formed in the cell upper part. That is, with only the n-type FETs being placed in the cell lower part, the above-described configuration can be implemented by replacing some of transistors placed in the cell upper part with n-type FETs. It is therefore possible to avoid complication of the manufacturing process.

(Alteration 3)

Figure 6:
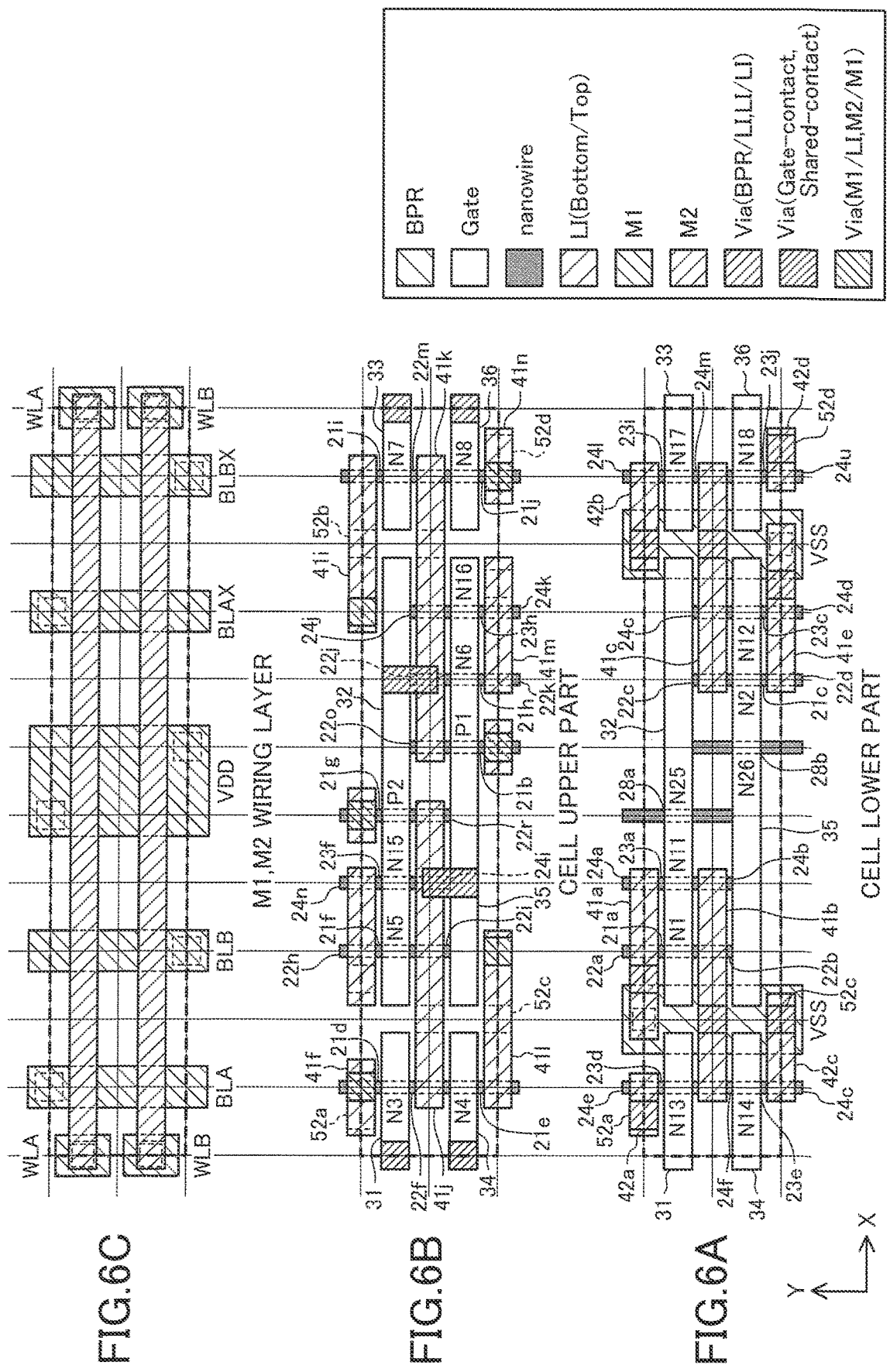
FIGS. 6A-6C are plan views showing yet another example of the layout structure of the two-port SRAM cell according to the first embodiment.

FIGS. 6A-6C are plan views showing yet another example of the layout structure of the two-port SRAM cell according to the first embodiment. Specifically, FIG. 6A shows a cell lower part, FIG. 6B shows a cell upper part, and FIG. 6C shows M1 and M2 layers. In FIGS. 6A-6C, in comparison with FIGS. 1A-1C, transistors N11 to N14, N17, and N18 and dummy transistors N25 and N26 are formed in the cell lower part, in addition to the transistors N1 and N2, and the dummy transistors N21 to N24 are omitted. Also, transistors N15, N16, and P1 are formed in the cell upper part, in addition to the transistors N3 to N8 and P2.

In the cell lower part, local interconnects 42a to 42d are formed. In the cell upper part, the local interconnect 41j is connected with the pads 22f, 22i, 22r, and 24i, and the local interconnect 41k is connected with the pads 22j, 22m, 22o, and 24j.

In this alteration, the transistors N1, N5, N11, and N15 correspond to the drive transistor PD1, and the transistors N2, N6, N12, and N16 correspond to the drive transistor PD2. The transistors N3 and N13 correspond to the access transistor PG1, the transistors N7 and N17 correspond to the access transistor PG2, the transistors N4 and N14 correspond to the access transistor PG3, and the transistors N8 and N18 correspond to the access transistor PG4.

Therefore, in this alteration, the drive transistors PD1 and PD2 are each constituted by four parallel-connected n-type FETs, and the access transistors PG1 to PG4 are each constituted by two parallel-connected n-type FETs. Also, the transistors including the dummy transistors are each stacked with another transistor. Moreover, the transistors including the dummy transistors formed in the cell lower part are only n-type FETs. With this alteration, similar effects to those obtained in the two-port SRAM cell of the first embodiment can be obtained.

Also, the drive transistor PD1 is constituted by the parallel-connected transistors N1, N5, N11, and N15, the drive transistor PD2 is constituted by the parallel-connected transistors N2, N6, N12, and N16, the access transistor PG1 is constituted by the parallel-connected transistors N3 and N13, the access transistor PG2 is constituted by the parallel-connected transistors N7 and N17, the access transistor PG3 is constituted by the parallel-connected transistors N4 and N14, and the access transistor PG4 is constituted by the parallel-connected transistors N8 and N18. Also, the transistors N11 to N14, N17, and N18 overlap the transistors N15, N16, N3, N4, N7, and N8, respectively, as viewed in plan. It is therefore possible to reduce the area of the two-port SRAM cell while improving the drive capability of the cell.

Moreover, the transistors N3 to N8, N15, N16, P1, and P2 overlap the transistors N13, N14, N1, N2, N17, N18, N11, and N12 and the dummy transistors N26 and N25, respectively, as viewed in plan. That is, each of the transistors including the dummy transistors is in a stacked state with another transistor. Since this eliminates the necessity of doing work such as removal of some transistors, complication of the manufacturing process can be avoided.

The transistors N1, N2, N1l to N14, N17, and N18 and the dummy transistors N25 and N26 are formed in the cell lower part, and the transistors N3 to N8, N15, N16, P1, and P2 are formed in the cell upper part. That is, with only the n-type FETs being placed in the cell lower part, the above-described configuration can be implemented by replacing some of transistors placed in the cell upper part with n-type FETs. It is therefore possible to avoid complication of the manufacturing process.

(Alteration 4)

Figure 7:
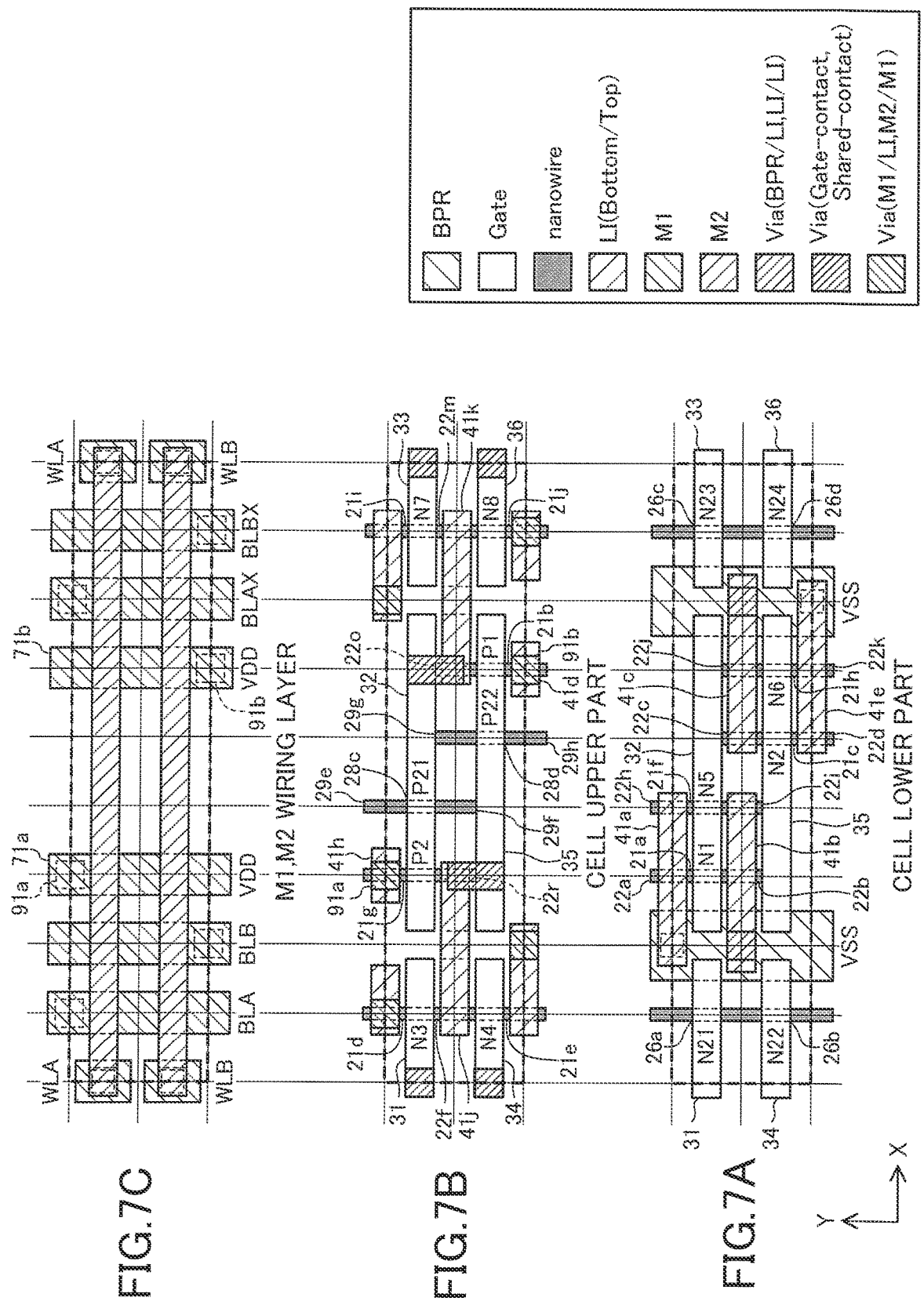
FIGS. 7A-7C are plan views showing yet another example of the layout structure of the two-port SRAM cell according to the first embodiment.

FIGS. 7A-7C are plan views showing yet another example of the layout structure of the two-port SRAM cell according to the first embodiment. Specifically, FIG. 7A shows a cell lower part, FIG. 7B shows a cell upper part, and FIG. 7C shows M1 and M2 layers. In FIGS. 7A-7C, in comparison with FIGS. 1A-1C, the transistors N5 and N6 are formed in the cell lower part, in addition to the transistors N1 and N2 and the dummy transistors N21 to N24. Also, the transistor P1 and dummy transistors P21 and P22 are formed in the cell upper part, in addition to the transistors N3, N4, N7, N8, and P2.

More specifically, the nanowires 21f and 21h are formed in the cell lower part, and the nanowire 21b and nanowires 28c and 28d extending in the Y direction are formed in the cell upper part.

The nanowire 21f is formed side by side with the nanowires 21a, 26a, and 26c in the X direction, and the nanowire 21h is formed side by side with the nanowires 21c, 26b, and 26d in the X direction. The nanowire 28c is formed side by side with the nanowires 21d, 21g, and 21i in the X direction, and the nanowires 21b and 28d are formed side by side with the nanowires 21e and 21j in the X direction.

The nanowires 21a, 21f, 21c, and 21h overlap the nanowires 21g, 28c, 28d, and 21b, respectively, as viewed in plan.

Dummy pads 29e to 29h doped with a p-type semiconductor are formed at the upper end of the nanowire 28c, at the lower end of the nanowire 28c, at the upper end of the nanowire 28d, and at the lower end of the nanowire 28d, respectively, as viewed in the figure. The nanowires 28c and 28d constitute the channel portions of the dummy transistors P21 and P22, respectively. The dummy pads 29e and 29f constitute the nodes of the dummy transistor P21, and the dummy pads 29g and 29h constitute the nodes of the dummy transistor P22. Note that the dummy transistors P21 and P22 are transistors having no logical functions.

Therefore, the transistors P1 and P2 and the dummy transistors P21 and P22 overlap the transistors N6, N1, N5, and N2, respectively, as viewed in plan.

Also, the transistors N5 and N6 are formed side by side with the transistors N1 and N2, respectively, in the X direction.

As shown in FIG. 7C, interconnects 71a and 71b extending in the Y direction are formed in the M1 wiring layer. The interconnects 71a and 71b supply the voltage VDD. The interconnect 71a is connected with the local interconnect 41h through a contact 91a, and the interconnect 71b is connected with the local interconnect 41d through a contact 91b.

In this alteration, the transistors corresponding to each of the drive transistors PD1 and PD2 are formed side by side in the X direction in the cell lower part. Also, the transistors corresponding to the load transistors PU1 and PU2 are formed in the cell upper part, and are stacked on the transistors corresponding to the drive transistors PD1 and PD2. With this alteration, similar effects to those obtained in the two-port SRAM cell of the first embodiment can be obtained.

Also, the transistors N1, N2, N5, and N6 and the dummy transistors N21 to N24 overlap the transistor P2, the dummy transistors P22 and P21, and the transistors P1, N3, N4, N7, and N8, respectively, as viewed in plan. That is, each of the transistors including the dummy transistors is in a stacked state with another transistor. Since this eliminates the necessity of doing work such as removal of some transistors, complication of the manufacturing process can be avoided.

Also, the transistors N1, N2, N5, and N6 and the dummy transistors N21 to N24 are formed in the cell lower part, and the transistors N3, N4, N7, N8, P1, and P2 and the dummy transistors P21 and P22 are formed in the cell upper part. That is, with only the n-type FETs being placed in the cell lower part, the above-described configuration can be implemented by replacing some of transistors placed in the cell upper part with n-type FETs. It is therefore possible to avoid complication of the manufacturing process.

Second Embodiment

Figure 8:
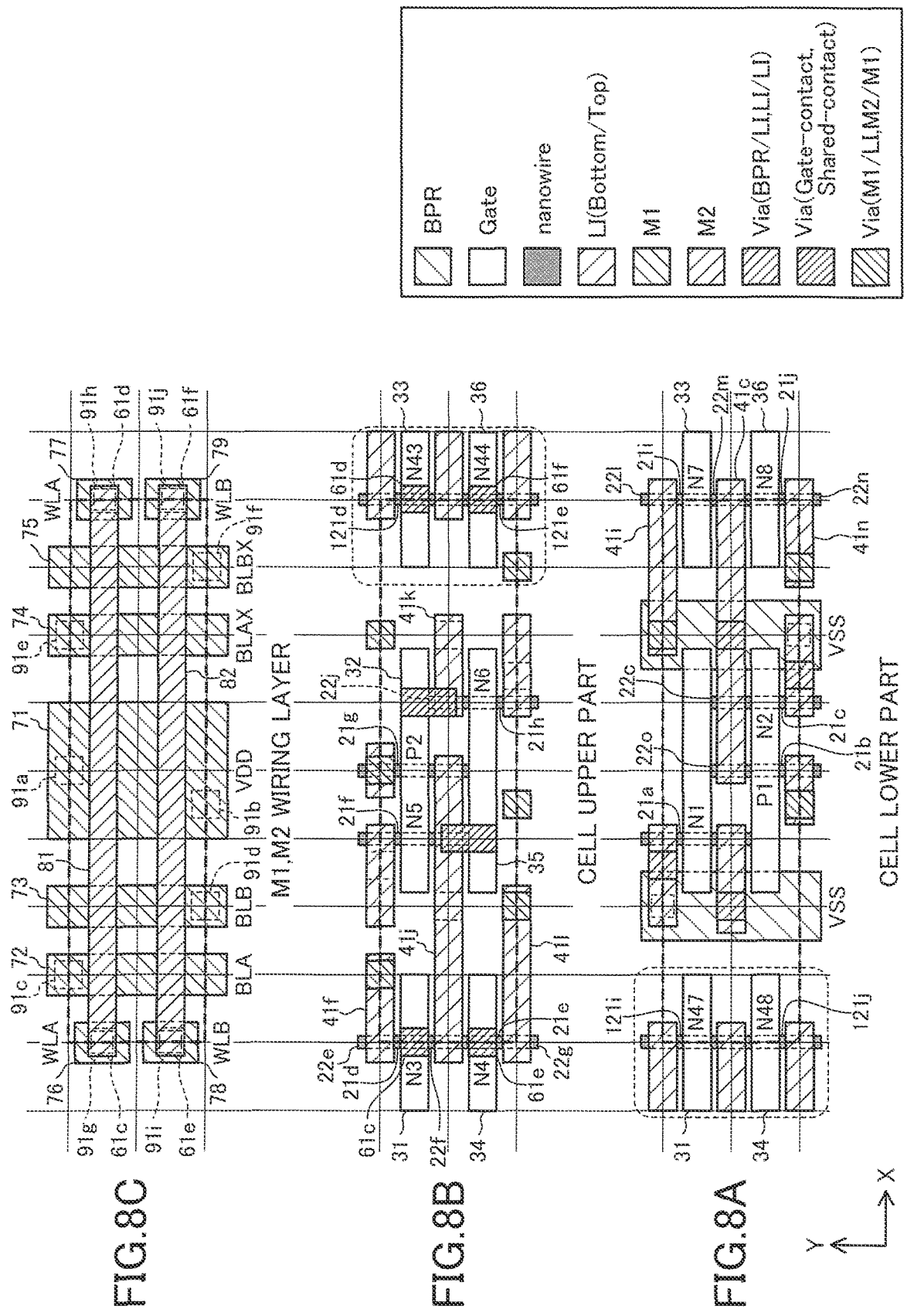
FIGS. 8A-8C are plan views showing an example of a layout structure of a two-port SRAM cell according to the second embodiment.

FIGS. 8A-8C are views showing an example of a layout structure of a two-port SRAM cell according to the second embodiment. Specifically, FIG. 8A shows a lower part, FIG. 8B shows an upper part, and FIG. 8C shows M1 and M2 layers. In FIGS. 8A-8C, transistors N1, N2, N7, N8, N47, N48, and P1 are formed in the cell lower part, and transistors N3 to N6, N43, N44, and P2 are formed in the cell upper part. Note that, in FIGS. 8A-8C, other two-port SRAM cells are placed adjacent to the two-port SRAM cell according to this embodiment in the X direction. Specifically, the transistors N43 and N44 are transistors included in a two-port SRAM cell placed on the right side of the two-port SRAM cell of this embodiment in the figure. Also, the transistors N47 and N48 are transistors included in a two-port SRAM cell placed on the left side of the two-port SRAM cell of this embodiment in the figure.

To state more specifically, the nanowires 21i and 21j are formed in the cell lower part. Nanowires 121i and 121j extending in the Y direction are formed on the left end in the cell lower part in the figure, and nanowires 121d and 121e extending in the Y direction are formed on the right end in the cell upper part in the figure.

The nanowire 121d is formed side by side with the nanowires 21d, 21f, and 21g in the X direction, and the nanowire 121e is formed side by side with the nanowires 21e and 21h in the X direction. The nanowire 121i is formed side by side with the nanowires 21a and 21i in the X direction, and the nanowire 121j is formed side by side with the nanowires 21b, 21c, and 21j in the X direction.

The nanowires 121d and 121e are formed in line in the Y direction, and the nanowires 121i and 121j are formed in line in the Y direction.

The nanowires 121d, 121e, 121i, and 121j overlap the nanowires 21i, 21j, 21d, and 21e, respectively, as viewed in plan.

The gate interconnect 33 is to be the gate of the transistor N43, and the gate interconnect 36 is to be the gate of the transistor N44. The gate interconnect 31 is to be the gate of the transistor N47, and the gate interconnect 34 is to be the gate of the transistor N48.

That is, the transistors N43 and N44 overlap the transistor N7 and N8, respectively, as viewed in plan. The transistors N47 and N48 overlap the transistor N3 and N4, respectively, as viewed in plan.

The transistor N43 is formed side by side with the transistors N3, N5, and P2 in the X direction, and the transistor N44 is formed side by side with the transistors N4 and N6 in the X direction. The transistor N47 is formed side by side with the transistors N1 and N7 in the X direction, and the transistor N48 is formed side by side with the transistors N2, N8, and P1 in the X direction.

The transistors N43 and N44 are formed in line in the Y direction, and the transistors N47 and N48 are formed in line in the Y direction.

In the cell lower part, the local interconnect 41c is connected with the pads 22c, 22m, and 22o. In the cell upper part, the local interconnect 41k is connected with the pad 22j.

With the above configuration, the two-port SRAM circuit is made up of the transistors N1 to N8, P1, and P2. The transistors N1, N2, N7, N8, and P1 are formed in the cell lower part, and the transistors N3 to N6 and P2 are formed in the cell upper part. The transistors N1 to N8, P1, and P2 are all three-dimensional transistors. In this way, the two-port SRAM cell using CFETs can be implemented.

Also, the transistors P1 and P2 are formed at the same position in the X direction as viewed in plan. This makes it possible to reduce the area of the two-port SRAM cell.

The drive transistor PD1 is constituted by the parallel-connected transistors N1 and N5, and the drive transistor PD2 is constituted by the parallel-connected transistors N2 and N6. Also, the transistors N1 and N2 overlap the transistors N5 and N6, respectively, as viewed in plan. It is therefore possible to reduce the area of the two-port SRAM cell while improving the drive capability of the cell.

Also, the transistors N43 and N44 respectively correspond to the transistors N3 and N4 in the two-port SRAM cell placed on the right side of the two-port SRAM cell of this embodiment in the figure. Also, the transistors N47 and N48 respectively correspond to the transistors N7 and N8 in the two-port SRAM cell placed on the left side of the two-port SRAM cell of this embodiment in the figure. The transistors N43 and N44 overlap the transistors N7 and N8, respectively, as viewed in plan, and the transistors N47 and N48 overlap the transistors N3 and N4, respectively, as viewed in plan. That is, the transistor N3 corresponding to the access transistor PG1 and the transistor N47 corresponding to the access transistor PG2 of the adjacent two-port SRAM cell on the left side are stacked one upon the other. The transistor N7 corresponding to the access transistor PG2 and the transistor N43 corresponding to the access transistor PG1 of the adjacent two-port SRAM cell on the right side are stacked one upon the other. The transistor N4 corresponding to the access transistor PG3 and the transistor N48 corresponding to the access transistor PG4 of the adjacent two-port SRAM cell on the left side are stacked one upon the other. The transistor N8 corresponding to the access transistor PG4 and the transistor N44 corresponding to the access transistor PG3 of the adjacent two-port SRAM cell on the right side are stacked one upon the other. This makes it possible to reduce the area of the two-port SRAM cell.

Note that, in this embodiment, any two-port SRAM cell placed adjacently in the X direction is not inverted in the X direction, and any two-port SRAM cell placed adjacently in the Y direction is inverted in the Y direction.

The transistors N3, N4, N43, and N44 may be formed in the cell lower part, and the transistors N7, N8, N47, and N48 may be formed in the cell upper part. In this case, local interconnects and contacts are to be formed so that a two-port SRAM circuit be formed in the two-port SRAM cell of this embodiment.

(Alteration 1)

Figure 9:
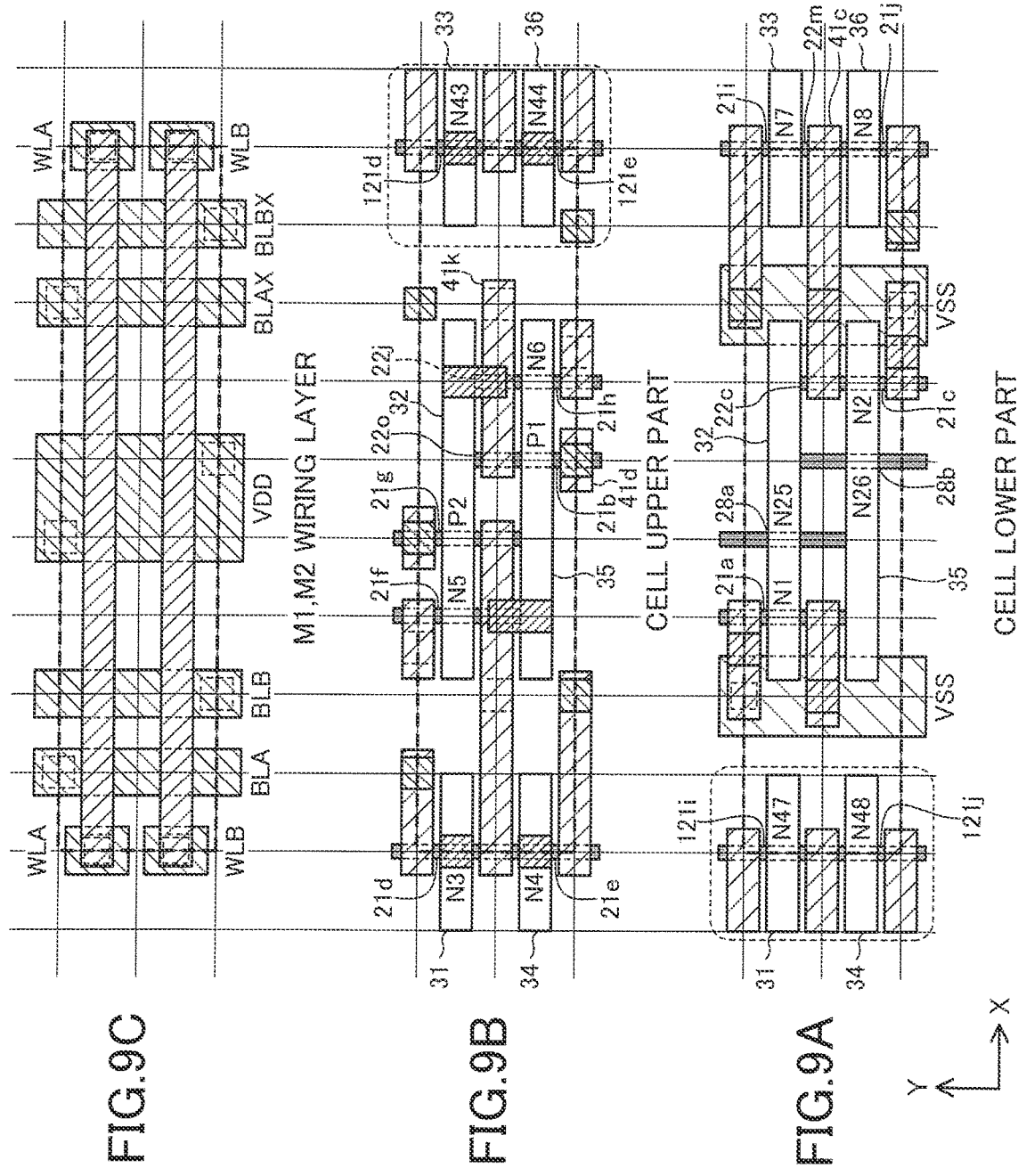
FIGS. 9A-9C are plan views showing another example of the layout structure of the two-port SRAM cell according to the second embodiment.

FIGS. 9A-9C are views showing another example of the layout structure of the two-port SRAM cell according to the second embodiment. Specifically, FIG. 9A shows a cell lower part, FIG. 9B shows a cell upper part, and FIG. 9C shows M1 and M2 layers. In FIGS. 9A-9C, in comparison with FIGS. 8A-8C, the transistor P1 is formed in the cell upper part, and dummy transistors N25 and N26 are formed in the cell lower part.

More specifically, the nanowire 21b is formed in the cell upper part, and nanowires 28a and 28b are formed in the cell lower part.

The nanowire 21b is formed side by side with the nanowires 21e, 21h, and 121e in the X direction. The nanowire 28a is formed side by side with the nanowires 21a, 21i, and 121i in the X direction, and the nanowire 28b is formed side by side with the nanowires 21c, 21j, and 121j in the X direction.

The nanowires 21g and 21b overlap the nanowires 28a and 28b, respectively, as viewed in plan. That is, the transistors P2 and P1 overlap the dummy transistors N25 and N26, respectively, as viewed in plan.

The transistor P1 is formed side by side with the transistors N4. N6, and N44 in the X direction. The dummy transistor N25 is formed side by side with the transistor N1, N7, and N47 in the X direction. The dummy transistor N26 is formed side by side with the transistors N2. N8, and N48 in the X direction.

In the cell lower part, the local interconnect 41c is connected with the pads 22c and 22m. In the cell upper part, the local interconnect 41k is connected with the pads 22j and 22o.

In this alteration, each of the transistors including the dummy transistors is in a stacked state with another transistor. The transistors including the dummy transistors formed in the cell lower part are only n-type FETs. With this alteration, similar effects to those obtained in the two-port SRAM cell of the second embodiment can be obtained.

Also, the transistors N1, N2, N7, N8, N47, and N48 and the dummy transistors N25 and N26 overlap the transistors N5, N6, N43, N44, N3, N4, P2, and P1, respectively, as viewed in plan. That is, each of the transistors including the dummy transistors is in a stacked state with another transistor. Since this eliminates the necessity of doing work such as removal of some transistors, complication of the manufacturing process can be avoided.

The transistors N1, N2, N7, N8, N47, and N48 and the dummy transistors N25 and N26 are formed in the cell lower part, and the transistors N3 to N6, N43, N44, P1, and P2 are formed in the cell upper part. That is, with only the n-type FETs being placed in the cell lower part, the above-described configuration can be implemented by replacing some of transistors placed in the cell upper part with n-type FETs. It is therefore possible to avoid complication of the manufacturing process.

(Alteration 2)

Figure 10:
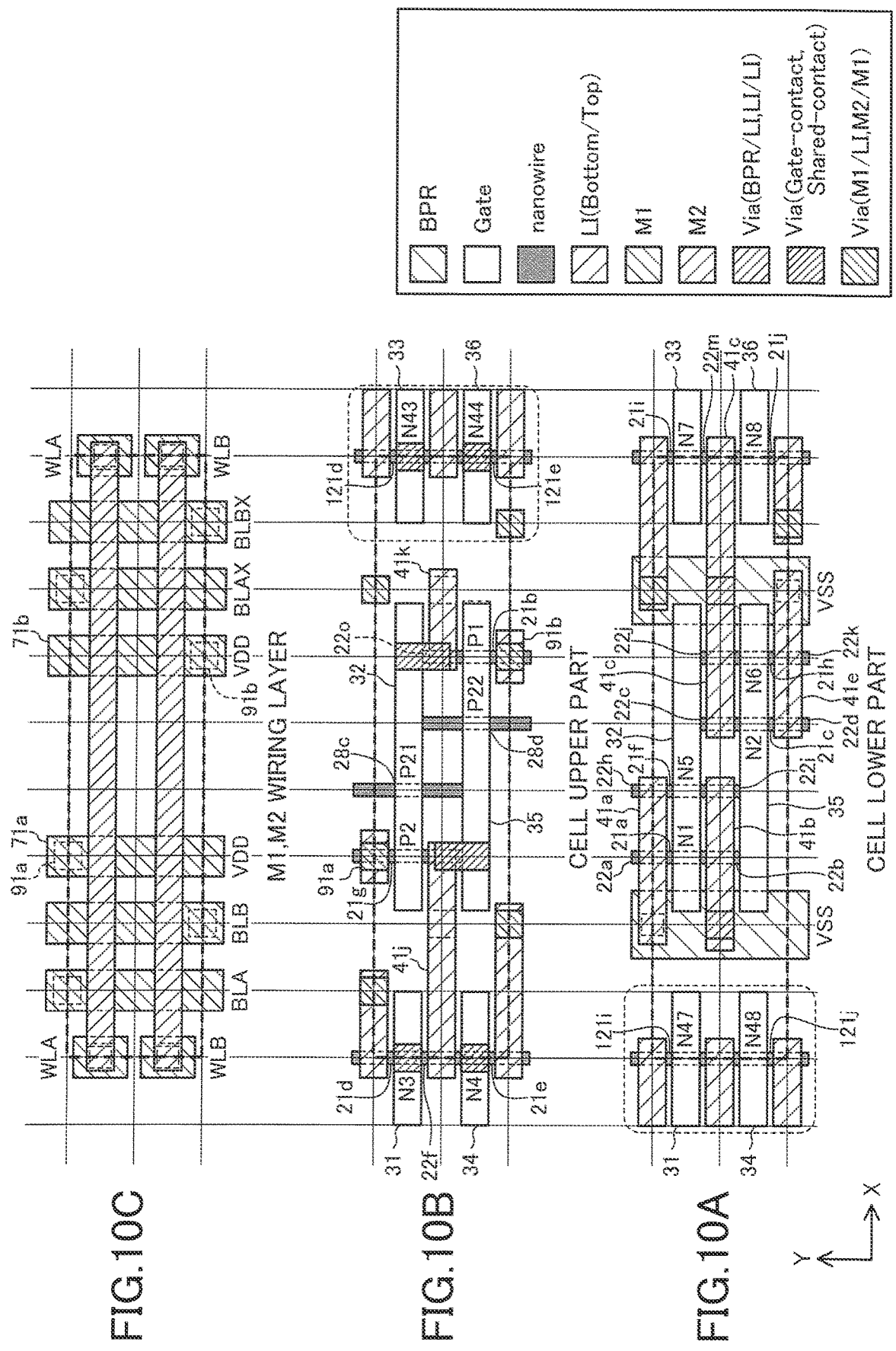
FIGS. 10A-10C are plan views showing yet another example of the layout structure of the two-port SRAM cell according to the second embodiment.

FIGS. 10A-10C are plan views showing yet another example of the layout structure of the two-port SRAM cell according to the second embodiment. Specifically, FIG. 10A shows a cell lower part, FIG. 10B shows a cell upper part, and FIG. 10C shows M1 and M2 layers. In FIGS. 10A-10C, in comparison with FIGS. 8A-8C, the transistors N5 and N6 are formed in the cell lower part, in addition to the transistors N1, N2, N7, N8, N47, and N48. Also, the transistor P1 and dummy transistors P21 and P22 are formed in the cell upper part, in addition to the transistors N3, N4, N43, N44, and P2.

More specifically, the nanowires 21f and 21h are formed in the cell lower part, and the nanowire 21b and nanowires 28c and 28d are formed in the cell upper part.

The nanowire 21f is formed side by side with the nanowires 21a, 21i, and 121i in the X direction, and the nanowire 21h is formed side by side with the nanowires 21c. 21j, and 121j in the X direction. The nanowire 28c is formed side by side with the nanowires 21d, 21g, and 121d in the X direction, and the nanowires 21b and 28d are formed by side with the nanowires 21e and 121e in the X direction.

The nanowires 21a, 21f, 21c, and 21h overlap the nanowires 21g, 28c, 28d, and 21b, respectively, as viewed in plan. That is, the transistors P1 and P2 and the dummy transistors P21 and P22 overlap the transistors N6, N1, N5, and N2, respectively, as viewed in plan.

Also, the transistor N5 is formed side by side with the transistors N1, N7, and N47 in the X direction, and the transistor N6 is formed side by side with the transistors N2, N8, and N48 in the X direction.

In the cell lower part, the local interconnect 41a is connected with the pads 22a and 22h, the local interconnect 41b is connected with the pads 22b and 22i, the local interconnect 41c is connected with the pads 22c, 22j, and 22m, and the local interconnect 41e is connected with the pads 22d and 22k. In the cell upper part, the local interconnect 41k is connected with the pad 22o.

In this alteration, the transistors corresponding to each of the drive transistors PD1 and PD2 are formed side by side in the X direction in the cell lower part. Also, the transistors corresponding to the load transistors PU1 and PU2 are formed in the cell upper part, and are stacked on the transistors corresponding to the drive transistors PD1 and PD2. With this alteration, similar effects to those obtained in the two-port SRAM cell of the second embodiment can be obtained.

Also, the transistors N1, N2, N5 to N8, N47, and N48 overlap the transistor P2, the dummy transistors P22 and P21, and the transistors P1, N43, N44, N3, and N4, respectively, as viewed in plan. That is, each of the transistors including the dummy transistors is in a stacked state with another transistor. Since this eliminates the necessity of doing work such as removal of some transistors, complication of the manufacturing process can be avoided.

Also, the transistors N1, N2, N5 to N8, N47, and N48 are formed in the cell lower part, and the transistors N3, N4, N43, N44, P1, and P2 and the dummy transistors P21 and P22 are formed in the cell upper part. That is, with only the n-type FETs being placed in the cell lower part, the above-described configuration can be implemented by replacing some of transistors placed in the cell upper part with n-type FETs. It is therefore possible to avoid complication of the manufacturing process.

(Alteration 3)

FIGS. 11A-11C and 12A-12C are views showing yet another examples of the layout structure of the two-port SRAM cell according to the second embodiment.

Figure 11:
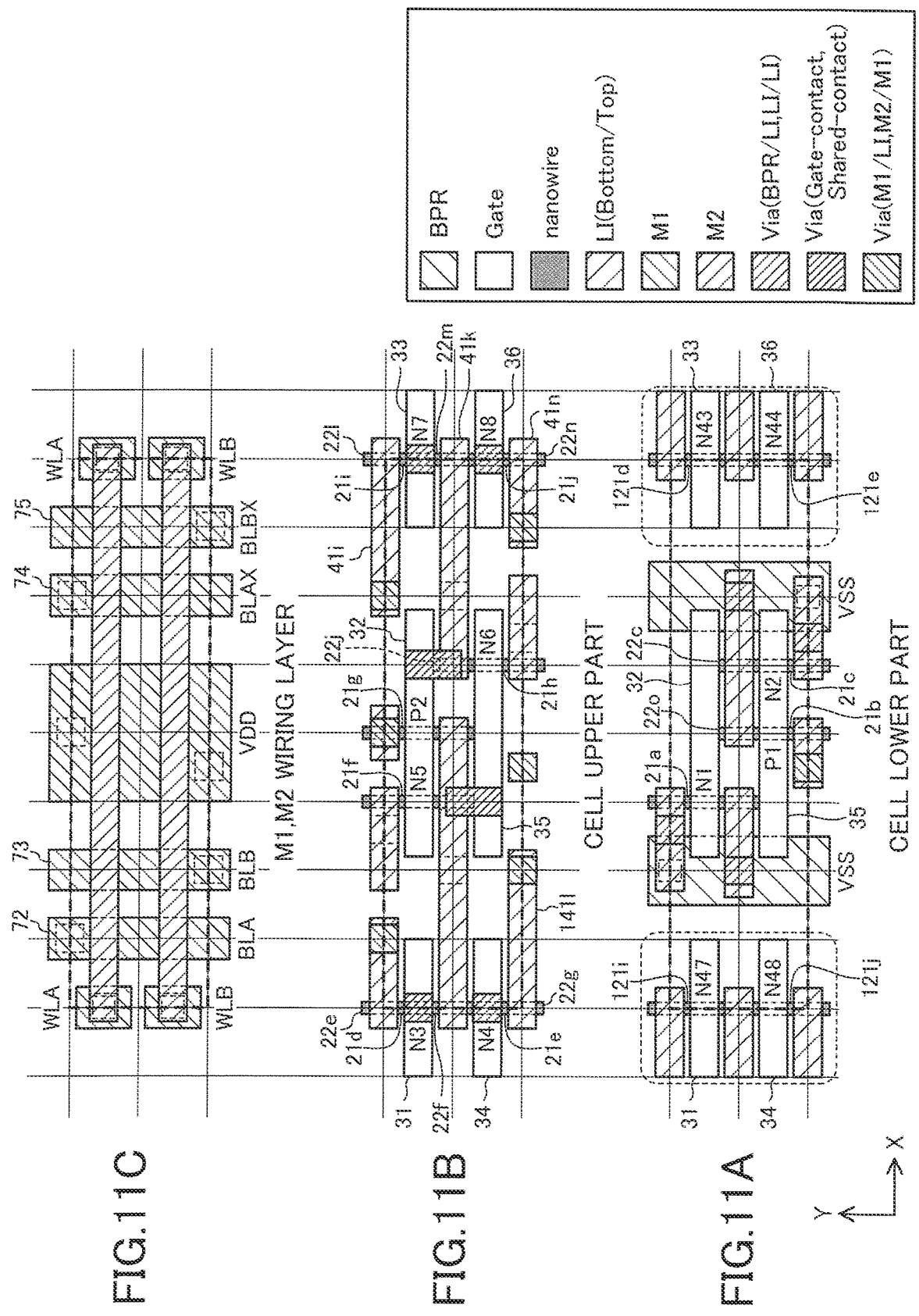
FIGS. 11A-11C are plan views showing yet another example of the layout structure of the two-port SRAM cell according to the second embodiment.
Figure 12:
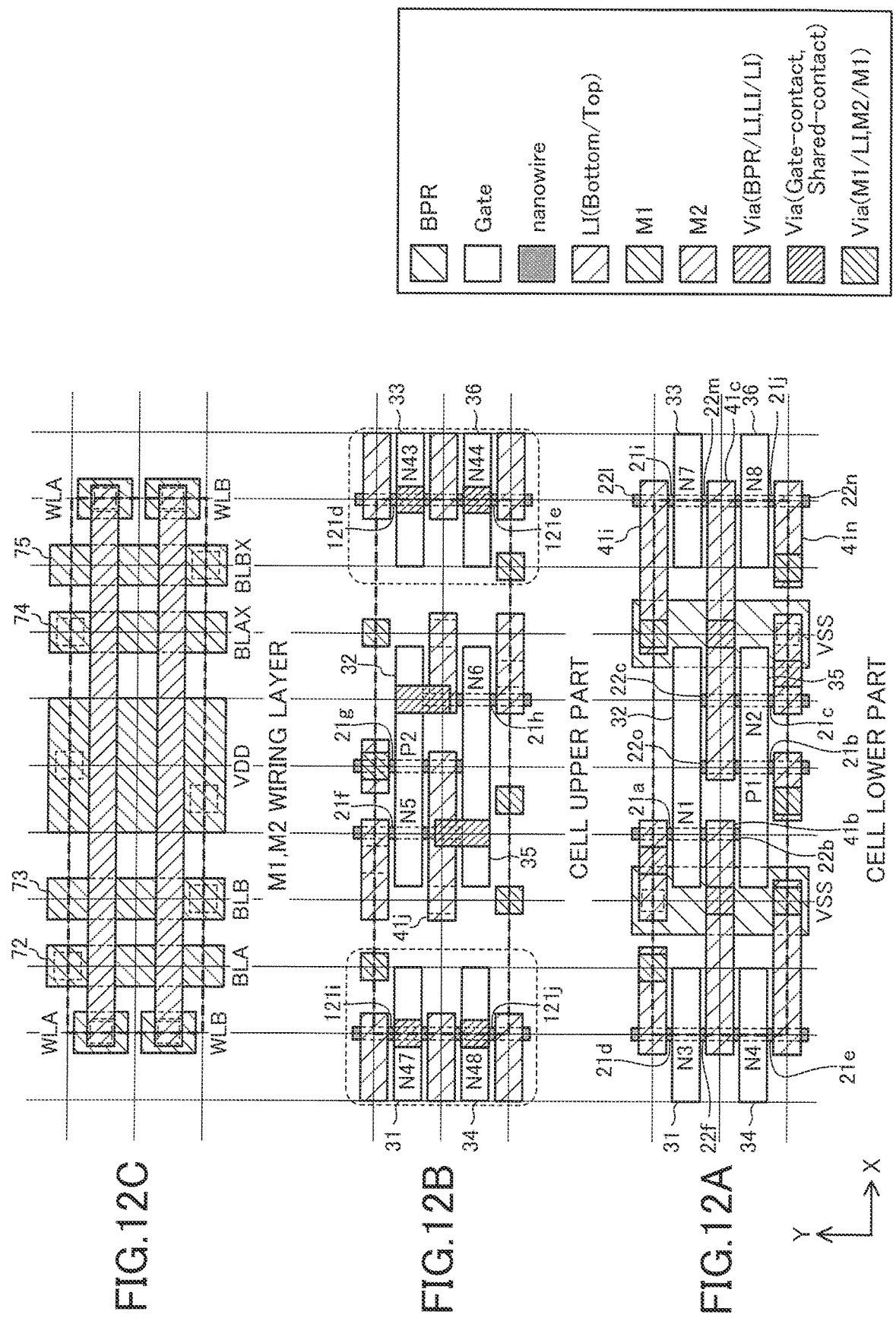
FIGS. 12A-12C are plan views showing yet another example of the layout structure of the two-port SRAM cell according to the second embodiment.

Specifically. FIGS. 11A and 12A each show a cell lower part, FIGS. 11B and 12B each show a cell upper part, and FIGS. 11C and 12C each show M1 and M2 layers.

In FIGS. 11A-11C, in comparison with FIGS. 8A-8C, the transistors N43 and N44 are formed in the cell lower part, in addition to the transistors N1, N2, N47, N48, and P1. Also, the transistors N7 and N8 are formed in the cell upper part, in addition to the transistors N3 to N6 and P2. In FIGS. 12A-12C, in comparison with FIGS. 8A-8C, the transistors N3 and N4 are formed in the cell lower part, in addition to the transistors N1, N2, N7, N8, and P1. Also, the transistors N47 and N48 are formed in the cell upper part, in addition to the transistors N5, N6, N43, N44, and P2.

In this alteration, the two-port SRAM cells shown in FIGS. 11A-11C and 12A-12C are alternately placed adjacently in the X direction. Specifically, in FIGS. 11A-11C, the transistors N43 and N44 are transistors included in the two-port SRAM cell shown in FIGS. 12A-12C placed on the right side in the figure, and the transistors N47 and N48 are transistors included in the two-port SRAM cell shown in FIGS. 12A-12C placed on the left side in the figure. Similarly, in FIGS. 12A-12C, the transistors N43 and N44 are transistors included in the two-port SRAM cell shown in FIGS. 11A-11C placed on the right side in the figure, and the transistors N47 and N48 are transistors included in the two-port SRAM cell shown in FIGS. 11A-11C placed on the left side in the figure.

In FIGS. 11A-11C and 12A-12C, the nanowires 21d, 21e, 21i, and 21j overlap the nanowires 121i, 121j, 121d, and 121e, respectively, as viewed in plan. That is, the transistors N3, N4, N7, and N8 overlap the transistors N47, N48, N43, and N44, respectively, as viewed in plan.

Specifically, in FIGS. 11A-11C, the nanowires 121*d*, 121*e*, 121*i*, and 121*j* are formed in the cell lower part, and the nanowires 21*d*, 21*e*, 21*i*, and 21*j* are formed in the cell upper part. Also, the nanowires 21*a*, 121*d*, and 121*i* are formed side by side in the X direction, and the nanowires 21*b*, 21*c*, 121*e*, and 121*j* are formed side by side in the X direction. The nanowires 21*d*, 21*f*, 21*g*, and 21*i* are formed side by side in the X direction, and the nanowires 21*e*, 21*h*, and 21*j* are formed side by side in the X direction.

That is, in FIGS. 11A-11C, the transistors N43, N44, N47, and N48 are formed in the cell lower part, and the transistors N3, N4, N7, and N8 are formed in the cell upper part. The transistors N1, N43, and N47 are formed side by side in the X direction, and the transistors N2, N44, N48, and P1 are formed side by side in the X direction. The transistors N3, N5, N7, and P2 are formed side by side in the X direction, and the transistors N4, N6, and N8 are formed side by side in the X direction.

In FIGS. 12A-12C, the nanowires 21*d*, 21*e*, 21*i*, and 21*j* are formed in the cell lower part, and the nanowires 121*d*, 121*e*, 121*i*, and 121*j* are formed in the cell upper part. Also, the nanowires 21*a*, 21*d*, and 21*i* are formed side by side in the X direction, and the nanowires 21*b*, 21*c*, 21*e*, and 21*j* are formed side by side in the X direction. The nanowires 21*f*, 21*g*, 121*d*, and 121*i* are formed side by side in the X direction, and the nanowires 21*h*, 121*e*, and 121*j* are formed side by side in the X direction.

That is, in FIGS. 12A-12C, the transistors N3, N4, N7, and N8 are formed in the cell lower part, and the transistors N43, N44, N47, and N48 are formed in the cell upper part. The transistors N1, N3, and N7 are formed side by side in the X direction, and the transistors N2, N4, N8, and P1 are formed side by side in the X direction. The transistors N5, N43, N47, and P2 are formed side by side in the X direction, and the transistors N6, N44, and N48 are formed side by side in the X direction.

In this alteration, the transistors corresponding to the access transistors PG1 to PG4 are formed in only either the cell upper part or the cell lower part. The transistors corresponding to the load transistors are formed at the same position in the X direction. Also, the transistors corresponding to each of the drive transistors PD1 and PD2 are stacked one upon the other. With this alteration, similar effects to those obtained in the two-port SRAM cell of the second embodiment can be obtained.

Also, in FIGS. 11A-11C, the transistors N3, N4, N7, and N8 are formed in the cell upper part. In FIGS. 12A-12C, the transistors N3, N4, N7, and N8 are formed in the cell lower part. That is, in FIGS. 11A-11C and 12A-12C, the transistors corresponding to the access transistors PG1 to PG4 are formed in only either the cell upper part or the cell lower part. This indicates that, even if the device characteristics differ between transistors formed in the cell upper part and those formed in the cell lower part, no deviation in characteristics will occur in the first and second complementary bit line pairs (between the first and second bit lines BLA and BLAX, and between the third and fourth bit lines BLB and BLBX) because the transistors corresponding to the access transistors PG1 to PG4 are formed in the same layer (in either the cell upper part or the cell lower part). With this, variations in transistor performance in the first and second complementary bit line pairs can be prevented. It is therefore possible to achieve increase in operation margin and stabilization of the operation in the semiconductor storage device.

In FIGS. 11A-11C and 12A-12C, the transistors P1 and P2 are formed at the same position in the X direction as viewed in plan. This makes it possible to reduce the area of the two-port SRAM cell.

In FIGS. 11A-11C and 12A-12C, the drive transistor PD1 is constituted by the parallel-connected transistors N1 and N5, and the drive transistor PD2 is constituted by the parallel-connected transistors N2 and N6. Also, the transistors N1 and N2 overlap the transistors N5 and N6, respectively, as viewed in plan. It is therefore possible to reduce the area of the two-port SRAM cell while improving the drive capability of the cell.

In FIGS. 11A-11C and 12A-12C, while the two-port SRAM cell shown in FIGS. 12A-12C is placed adjacent to the two-port SRAM cell shown in FIGS. 11A-11C without being inverted in the X direction, the two-port SRAM cell shown in FIGS. 12A-12C may be placed adjacently in a state inverted in the X direction. In this case, in the FIGS. 11A-11C, for example, the transistors N43 and N44 are to correspond to the transistors N7 and N8, respectively, in the two-port SRAM cell shown in FIGS. 12A-12C placed on the right side in the figure. Also, the transistors N47 and N47 are to correspond to the transistors N3 and N4, respectively, in the two-port SRAM cell shown in FIGS. 12A-12C placed on the left side in the figure.

(Alteration 4)

Figure 13:
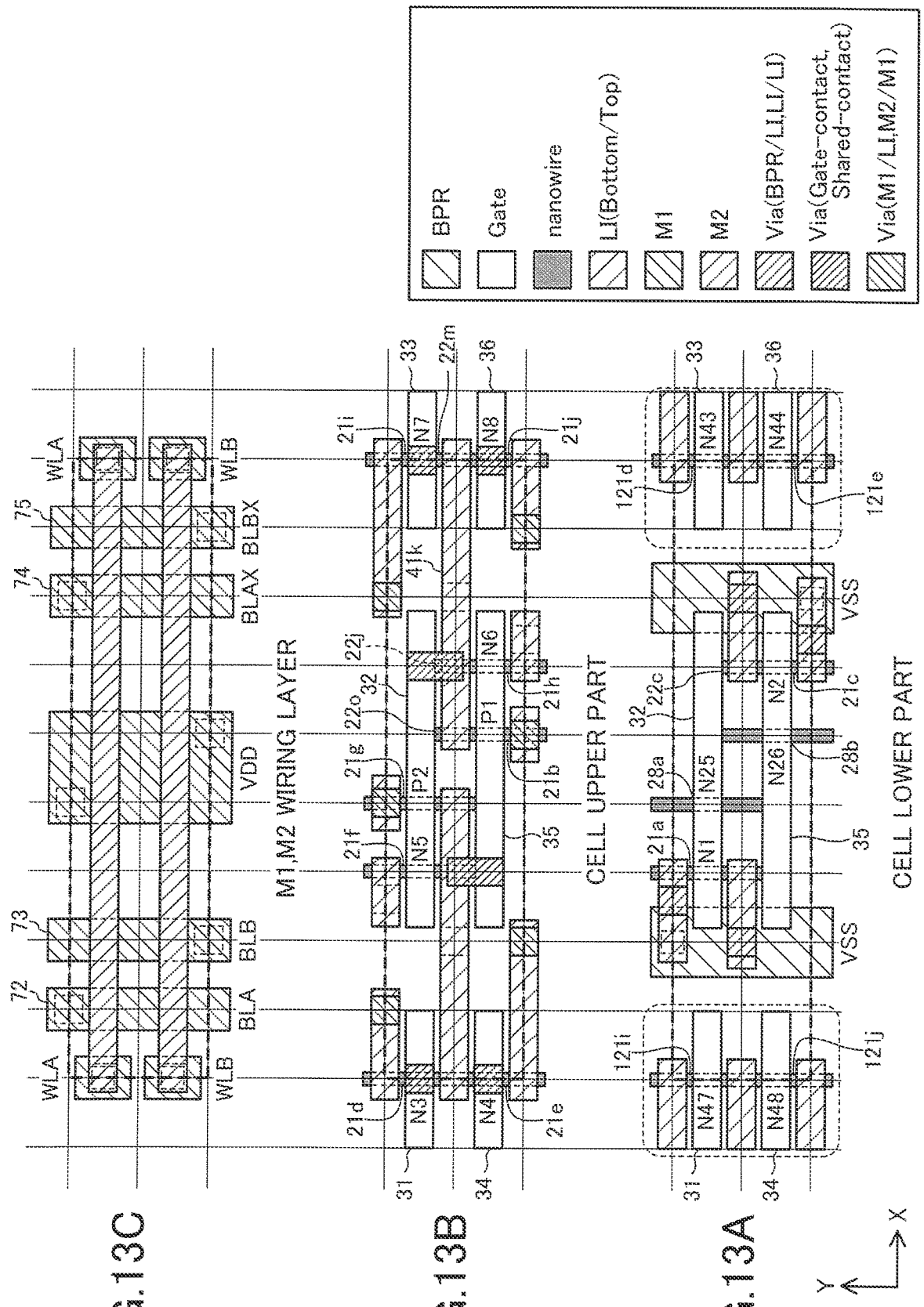
FIGS. 13A-13C are plan views showing yet another example of the layout structure of the two-port SRAM cell according to the second embodiment.
Figure 14:
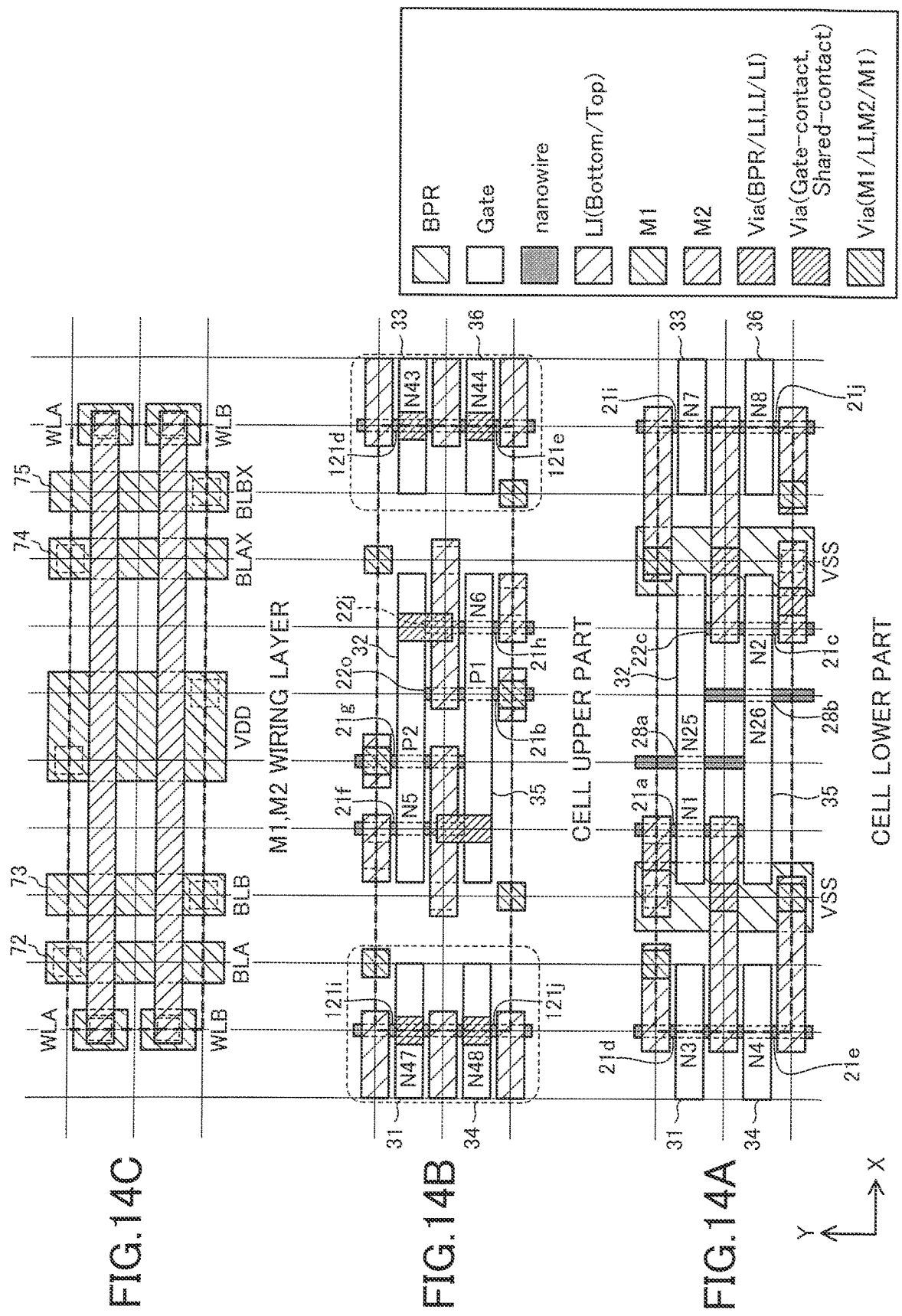
FIGS. 14A-14C are plan views showing yet another example of the layout structure of the two-port SRAM cell according to the second embodiment.

FIGS. 13A-13C and 14A-14C are views showing yet another examples of the layout structure of the two-port SRAM cell according to the second embodiment. Specifically. FIGS. 13A and 14A each show a cell lower part, FIGS. 13B and 14B each show a cell upper part, and FIGS. 13C and 14C each show M1 and M2 layers.

In FIGS. 13A-13C, in comparison with FIGS. 8A-8C, the transistors N43 and N44 and the dummy transistors N25 and N26 are formed in the cell lower part, in addition to the transistors N1, N2, N47, and N48. Also, the transistors N7, N8, and P1 are formed in the cell upper part, in addition to the transistors N3 to N6 and P2. In FIGS. 14A-14C, in comparison with FIGS. 8A-8C, the transistors N3 and N4 and the dummy transistors N25 and N26 are formed in the cell lower part, in addition to the transistors N1, N2, N7, and N8. Also, the transistors N47, N48, and P1 are formed in the cell upper part, in addition to the transistors N5, N6, N43, N44, and P2.

In this alteration, the two-port SRAM cells shown in FIGS. 13A-13C and 14A-14C are alternately placed adjacently in the X direction. Specifically, in FIGS. 13A-13C, the transistors N43 and N44 are transistors included in the two-port SRAM cell shown in FIGS. 14A-14C placed on the right side in the figure, and the transistors N47 and N48 are transistors included in the two-port SRAM cell shown in FIGS. 14A-14C placed on the left side in the figure. Similarly, in FIGS. 14A-14C, the transistors N43 and N44 are transistors included in the two-port SRAM cell shown in FIGS. 13A-13C placed on the right side in the figure, and the transistors N47 and N48 are transistors included in the two-port SRAM cell shown in FIGS. 13A-13C placed on the left side in the figure.

More specifically, in FIGS. 13A-13C and 14A-14C, the nanowires 21*d*, 21*e*, 21*i*, and 21*j* overlap the nanowires 121*i*, 121*j*, 121*d*, and 121*e*, respectively, as viewed in plan. That is, the transistors N3, N4, N7, and N8 overlap the transistors N47, N48, N43, and N44, respectively, as viewed in plan.

In FIGS. 13A-13C and 14A-14C, the nanowire 21*b* is formed in the cell upper part, and the nanowires 28*a* and 28*b* are formed in the cell lower part. The nanowires 21*g* and 21*h* overlap the nanowires 28*a* and 28*b*, respectively, as viewed in plan. That is, the transistors P2 and P1 overlap the dummy transistors N25 and N26, respectively, as viewed in plan.

In FIGS. 13A-13C, the nanowires 121d, 121e, 121i, and 121j are formed in the cell lower part, and the nanowires 21d, 21e, 21i, and 21j are formed in the cell upper part. Also, the nanowires 21a, 28a. 121d, and 121i are formed side by side in the X direction, and the nanowires 21c, 28b, 121e, and 121j are formed side by side in the X direction. The nanowires 21d, 21f, 21g, and 21i are formed side by side in the X direction, and the nanowires 21b, 21e, 21h, and 21j are formed side by side in the X direction.

That is, in FIGS. 13A-13C, the transistors N1, N43, and N47 and the dummy transistor N25 are formed side by side in the X direction, and the transistors N2, N44, and N47 and the dummy transistor N26 are formed side by side in the X direction. The transistors N3, N5, NT and P2 are formed side by side in the X direction, and the transistors N4, N6, N8, and P1 are formed side by side in the X direction.

In FIGS. 14A-14C, the nanowires 21d, 21e, 21i, and 21j are formed in the cell lower part, and the nanowires 121d, 121e, 121i, and 121j are formed in the cell upper part. Also, the nanowires 21a, 21d, 21i, and 28a are formed side by side in the X direction, and the nanowires 21c, 21e, 21j, and 28b are formed side by side in the X direction. The nanowires 21f, 21g, 121d, and 121i are formed side by side in the X direction, and the nanowires 21b, 21h, 121e, and 121j are formed side by side in the X direction.

That is, in FIGS. 14A-14C, the transistors N1, N3, and N7 and the dummy transistor N25 are formed side by side in the X direction, and the transistors N2, N4, and N8 and the dummy transistor N26 are formed side by side in the X direction. The transistors N5, N43, N47, and P2 are formed side by side in the X direction, and the transistors N6, N44, N48, and P1 are formed side by side in the X direction.

In this alteration, the transistors corresponding to the access transistors PG1 to PG4 are formed in only either the cell upper part or the cell lower part. Also, each of the transistors including the dummy transistors is in a stacked state with another transistor. The transistors including the dummy transistors formed in the cell lower part are only n-type FETs. With this alteration, similar effects to those obtained in the two-port SRAM cell of the second embodiment can be obtained.

Also, in FIGS. 13A-13C, the transistors N3, N4, N7, and N8 are formed in the cell upper part. In FIGS. 14A-14C, the transistors N3, N4, N7, and N8 are formed in the cell lower part. That is, in FIGS. 13A-13C and 14A-14C, the transistors corresponding to the access transistors PG1 to PG4 are formed in only either the cell upper part or the cell lower part. This indicates that, even if the device characteristics differ between transistors formed in the cell upper part and those formed in the cell lower part, no deviation in characteristics will occur in the first and second complementary bit line pairs (between the first and second bit lines BLA and BLAX, and between the third and fourth bit lines BLB and BLBX) because the transistors corresponding to the access transistors PG1 to PG4 are formed in the same layer (in either the cell upper part or the cell lower part). With this, variations in transistor performance in the first and second complementary bit line pairs can be prevented. It is therefore possible to achieve increase in operation margin and stabilization of the operation in the semiconductor storage device.

In FIGS. 13A-13C and 14A-14C, the transistors N1, N2, N43, N44, N47, and N48 and the dummy transistors N25 and N26 overlap the transistors N5 to N8, N3, N4, P2, and P1, respectively, as viewed in plan. That is, in FIGS. 13A-13C and 14A-14C, each of the transistors including the dummy transistors is in a stacked state with another transistor. Since this eliminates the necessity of doing work such as removal of some transistors, complication of the manufacturing process can be avoided.

Also, in FIGS. 13A-13C, the transistors N1, N2, N43, N44, N47, and N48 and the dummy transistors N25 and N26 are formed in the cell lower part, and the transistors N3 to N8, P1, and P2 are formed in the cell upper part. In FIGS. 14A-14C, the transistors N1 to N4, N7, and N8 and the dummy transistors N25 and N26 are formed in the cell lower part, and the transistors N5, N6, N43, N44, N47, N48, P1, and P2 are formed in the cell upper part.

That is, in FIGS. 13A-13C and 14A-14C, with only the n-type FETs being placed in the cell lower part, the above-described configuration can be implemented by replacing some of transistors placed in the cell upper part with n-type FETs. It is therefore possible to avoid complication of the manufacturing process.

In FIGS. 13A-13C and 14A-14C, while the two-port SRAM cell shown in FIGS. 14A-14C is placed adjacent to the two-port SRAM cell shown in FIGS. 13A-13C without being inverted in the X direction, the two-port SRAM cell shown in FIGS. 14A-14C may be placed adjacently in a state inverted in the X direction. In this case, in the FIGS. 13A-13C, for example, the transistors N43 and N44 correspond to the transistors N7 and N8, respectively, in the two-port SRAM cell shown in FIGS. 14A-14C placed on the right side in the figure. Also, the transistors N47 and N47 correspond to the transistors N3 and N4, respectively, in the two-port SRAM cell shown in FIGS. 14A-14C placed on the left side in the figure.

(Alteration 5)

Figure 15:
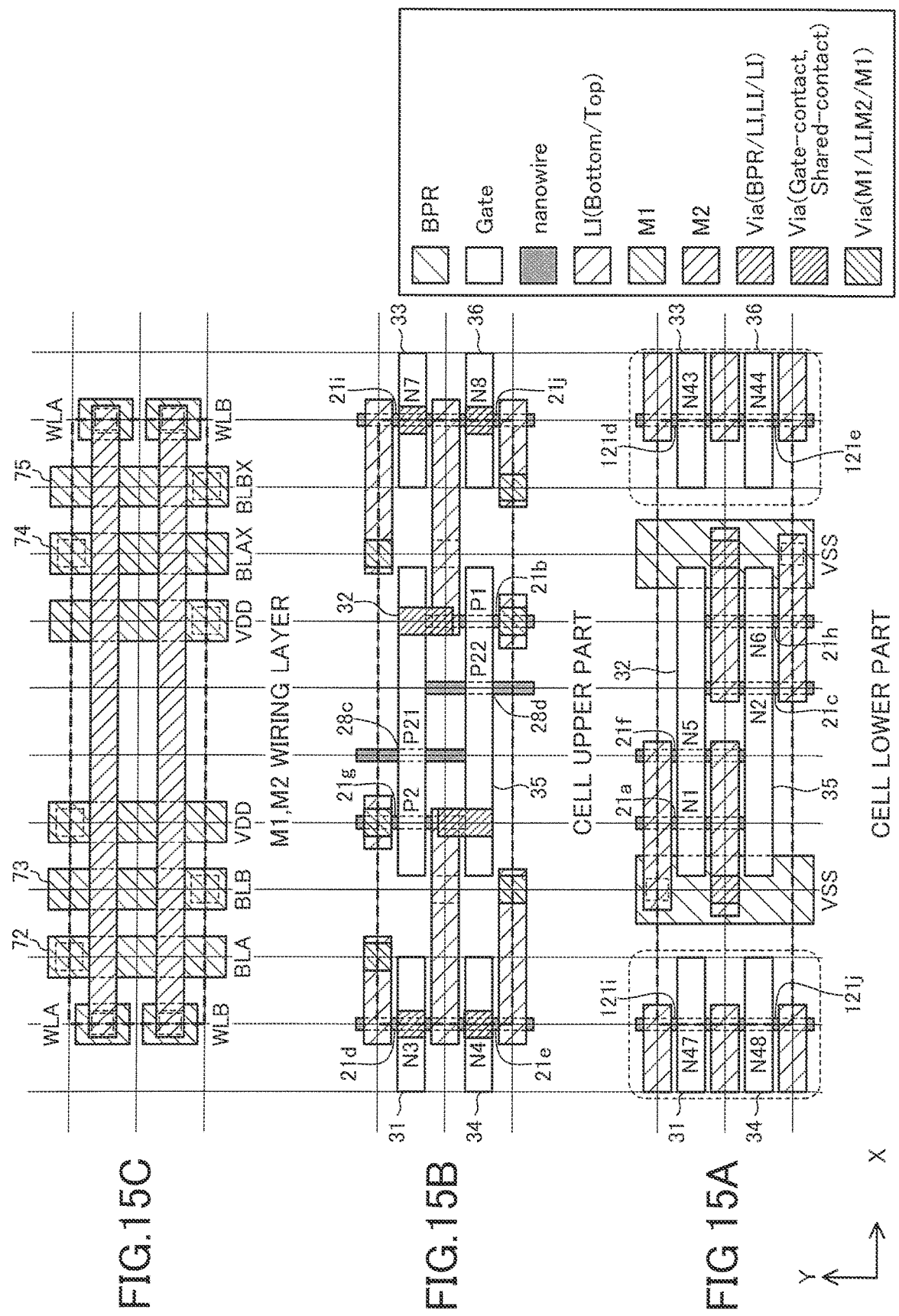
FIGS. 15A-15C are plan views showing yet another example of the layout structure of the two-port SRAM cell according to the second embodiment.
Figure 16:
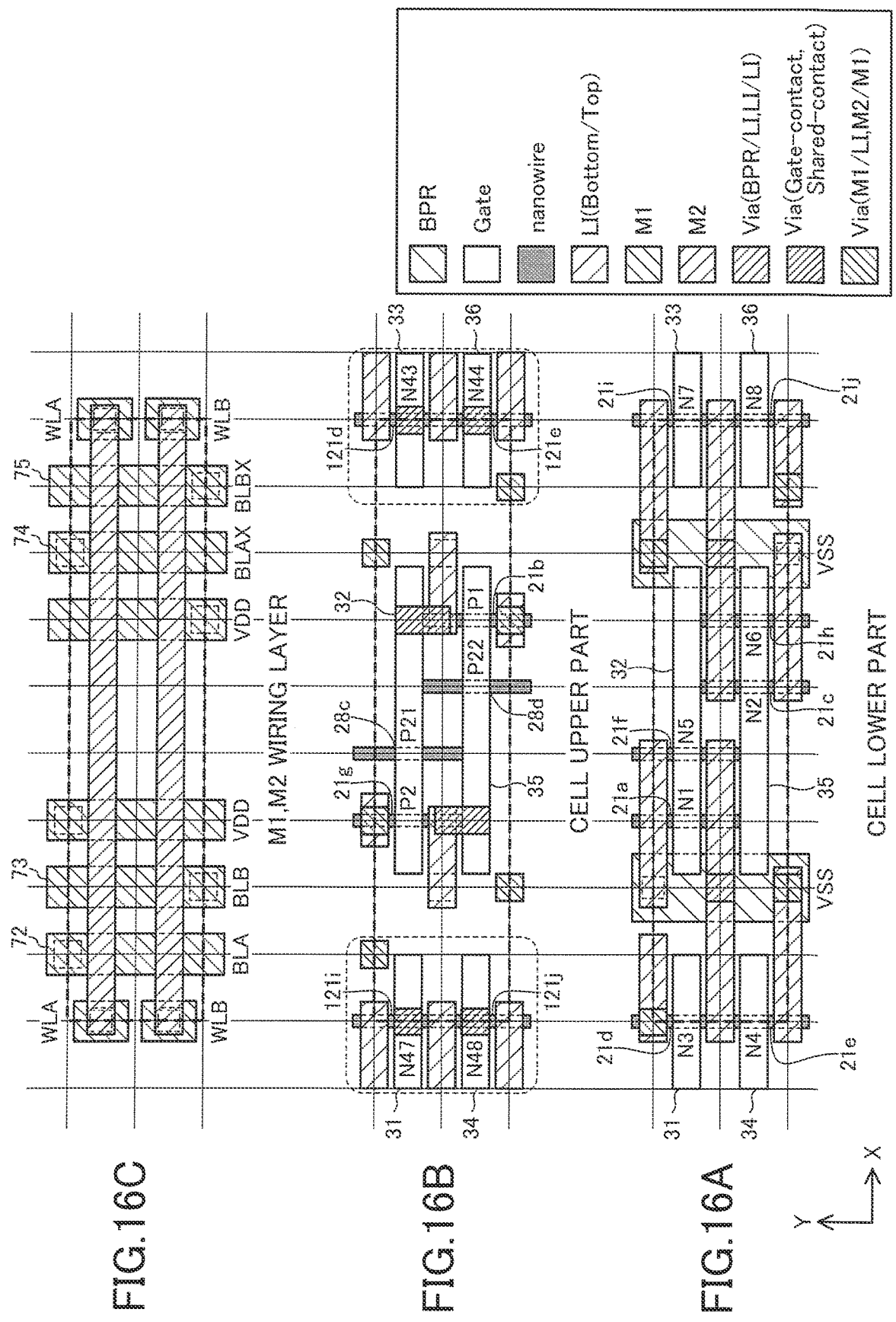
FIGS. 16A-16C are plan views showing yet another example of the layout structure of the two-port SRAM cell according to the second embodiment.

FIGS. 15A-15C and 16A-16C are views showing yet another examples of the layout structure of the two-port SRAM cell according to the second embodiment. Specifically, FIGS. 15A and 16A each show a cell lower part. FIGS. 15B and 16B each show a cell upper part, and FIGS. 15C and 16C each show M1 and M2 layers.

In FIGS. 15A-15C, in comparison with FIGS. 8A-8C, the transistors N5, N6, N43 and N44 are formed in the cell lower part, in addition to the transistors N1, N2, N47, and N48. Also, the transistors N7, N8, and P1 and the dummy transistors P21 and P22 are formed in the cell upper part, in addition to the transistors N3, N4, and P2. In FIGS. 16A-16C, in comparison with FIGS. 8A-8C, the transistors N3 to N6 are formed in the cell lower part, in addition to the transistors N1, N2, N7, and N8. Also, the transistors N47, N48, and P1 and the dummy transistors P21 and P22 are formed in the cell upper part, in addition to the transistors N43, N44, and P2.

In this alteration, the two-port SRAM cells shown in FIGS. 15A-15C and 16A-16C are alternately placed adjacently in the X direction. Specifically, in FIGS. 15A-15C, the transistors N43 and N44 are transistors included in the two-port SRAM cell shown in FIGS. 16A-16C placed on the right side in the figure, and the transistors N47 and N48 are transistors included in the two-port SRAM cell shown in FIGS. 16A-16C placed on the left side in the figure. Similarly, in FIGS. 16A-16C, the transistors N43 and N44 are transistors included in the two-port SRAM cell shown in FIGS. 15A-15C placed on the right side in the figure, and the transistors N47 and N48 are transistors included in the two-port SRAM cell shown in FIGS. 15A-15C placed on the left side in the figure.

More specifically, in FIGS. 15A-15C and 16A-16C, the nanowires 21d, 21e, 21i, and 21j overlap the nanowires 121i, 121*j*, 121*d*, and 121*e*, respectively, as viewed in plan. That is, the transistors N3, N4, N7, and N8 overlap the transistors N47, N48, N43, and N44, respectively, as viewed in plan.

In FIGS. 15A-15C and 16A-16C, the nanowires 21*f* and 21*h* are formed in the cell lower part, and the nanowires 28*c* and 28*d* are formed in the cell upper part. The nanowires 21*a*, 21*f*, 21*c*, and 21*h* overlap the nanowires 21*g*, 28*c*, 28*d*, and 21*b*, respectively, as viewed in plan. That is, the transistors P1 and P2 and the dummy transistors P21 and P22 overlap the transistors N6, N1, N5, and N2, respectively, as viewed in plan.

In FIGS. 15A-15C, the nanowires 121*d*, 121*e*, 121*i*, and 121*j* are formed in the cell lower part, and the nanowires 21*d*, 21*e*, 21*i*, and 21*j* are formed in the cell upper part. Also, the nanowires 21*a*, 21*f*, 121*d*, and 121*i* are formed side by side in the X direction, and the nanowires 21*c*, 21*h*, 121*e*, and 121*j* are formed side by side in the X direction. The nanowires 21*d*, 21*g*, 21*i*, and 28*c* are formed side by side in the X direction, and the nanowires 21*b*, 21*e*, 21*i*, and 28*d* are formed side by side in the X direction.

That is, in FIGS. 15A-15C, the transistors N1, N5, N43, and N47 are formed side by side in the X direction, and the transistors N2, N6, N44, and N48 are formed side by side in the X direction. The transistors N3, N7, and P2 and the dummy transistor P21 are formed side by side in the X direction, and the transistors N4, N8, and P1 and the dummy transistor P22 are formed side by side in the X direction.

In FIGS. 16A-16C, the nanowires 21*d*, 21*e*, 21*i*, and 21*j* are formed in the cell lower part, and the nanowires 121*d*, 121*e*, 121*i*, and 121*j* are formed in the cell upper part. Also, the nanowires 21*a*, 21*d*, 21*f*, and 21*i* are formed side by side in the X direction, and the nanowires 21*c*, 21*e*, 21*h*, and 21*j* are formed side by side in the X direction. The nanowires 21*g*, 28*c*, 121*d*, and 121*i* are formed side by side in the X direction, and the nanowires 21*b*, 28*d*, 121*e*, and 121*j* are formed side by side in the X direction.

That is, in FIGS. 16A-16C, the transistors N1, N3, N5, and N7 are formed side by side in the X direction, and the transistors N2, N4, N6, and N8 are formed side by side in the X direction. The transistors N43, N47, and P2 and the dummy transistor P21 are formed side by side in the X direction, and the transistors N44, N48, and P1 and the dummy transistor P22 are formed side by side in the X direction.

In this alteration, the transistors corresponding to the access transistors PG1 to PG4 are formed in only either the cell upper part or the cell lower part. Also, the transistors corresponding to each of the drive transistors PD1 and PD2 are formed side by side in the X direction in the cell lower part. The transistors corresponding to the load transistors PU1 and PU2 are formed in the cell upper part, and are stacked on the transistors corresponding to the drive transistors PD1 and PD2. With this alteration, similar effects to those obtained in the two-port SRAM cell of the second embodiment can be obtained.

Also, in FIGS. 15A-15C, the transistors N3, N4, N7, and N8 are formed in the cell upper part. In FIGS. 16A-16C, the transistors N3, N4, N7, and N8 are formed in the cell lower part. That is, in FIGS. 15A-15C and 16A-16C, the transistors corresponding to the access transistors PG1 to PG4 are formed in only either the cell upper part or the cell lower part. This indicates that, even if the device characteristics differ between transistors formed in the cell upper part and those formed in the cell lower part, no deviation in characteristics will occur in the first and second complementary bit line pairs (between the first and second bit lines BLA and BLAX, and between the third and fourth bit lines BLB and BLBX) because the transistors corresponding to the access transistors PG1 to PG4 are formed in the same layer (in either the cell upper part or the cell lower part). With this, variations in transistor performance in the first and second complementary bit line pairs can be prevented. It is therefore possible to achieve increase in operation margin and stabilization of the operation in the semiconductor storage device.

In FIGS. 15A-15C and 16A-16C, the transistors N1, N2, N5, N6, N43, N44, N47, and N48 overlap the transistor P2, the dummy transistors P22 and P21, and the transistors P1, N7, N8, N3, and N4, respectively, as viewed in plan. That is, in FIGS. 15A-15C and 16A-16C, each of the transistors including the dummy transistors is in a stacked state with another transistor. Since this eliminates the necessity of doing work such as removal of some transistors, complication of the manufacturing process can be avoided.

Also, in FIGS. 15A-15C, the transistors N1, N2, N5, N6, N43, N44, N47, and N48 are formed in the cell lower part, and the transistors N3, N4, N7, N8, P1, and P2 and the dummy transistors P21 and P22 are formed in the cell upper part. In FIGS. 16A-16C, the transistors N1 to N8 are formed in the cell lower part, and the transistors N43, N44, N47, N48, P1, and P2 and the dummy transistors P21 and P22 are formed in the cell upper part. That is, in FIGS. 15A-15C and 16A-16C, with only the n-type FETs being placed in the cell lower part, the above-described configuration can be implemented by replacing some of transistors placed in the cell upper part with n-type FETs. It is therefore possible to avoid complication of the manufacturing process can be avoided.

In FIGS. 15A-15C and 16A-16C, the two-port SRAM cell shown in FIGS. 16A-16C is placed adjacent to the two-port SRAM cell shown in FIGS. 15A-15C without being inverted in the X direction. Alternatively, the two-port SRAM cell shown in FIGS. 16A-16C may be placed adjacently in a state inverted in the X direction. In this case, in the FIGS. 15A-15C, for example, the transistors N43 and N44 correspond to the transistors N7 and N8, respectively, in the two-port SRAM cell shown in FIGS. 16A-16C placed on the right side in the figure. Also, the transistors N47 and N47 correspond to the transistors N3 and N4, respectively, in the two-port SRAM cell shown in FIGS. 16A-16C placed on the left side in the figure.

In the embodiments and alterations described above, while each transistor is assumed to have one nanowire, some or all transistors may have a plurality of nanowires. In this case, the plurality of nanowires may be arranged in the X direction as viewed in plan, or arranged in the Z direction. Alternatively, the plurality of nanowires may be arranged in both the X direction and the Z direction. The number of nanowires included in each transistor may be different between the cell upper and lower parts.

Also, in the above embodiments, each transistor may be constituted by a plurality of parallel-connected transistors.

While the cross-sectional shape of the nanowires is roughly square in the above embodiments, it is not limited to this. For example, the shape may be circular or rectangular.

While the above embodiments have been described taking nanowire FETs as an example of three-dimensional transistors, the transistor type is not limited to this. For example, a fin transistor may be used as the transistor formed in the lower part of the cell.

The present disclosure is applicable to a semiconductor storage device provided with an SRAM cell using CFETs. It is therefore possible to implement a two-port SRAM cell using CFETs and also reduce the area of such a two-port SRAM cell.

What is claimed is:

1. A semiconductor storage device including a two-port SRAM cell, the two-port SRAM cell comprising:
   a first transistor with one of its nodes connected to a first power supply that supplies a first voltage, the other node connected to a first node, and its gate connected to a second node:
   a second transistor with one of its nodes connected to the first power supply, the other node connected to the second node, and its gate connected to the first node;
   a third transistor with one of its nodes connected to the first node, the other node connected to a second power supply that supplies a second voltage, and its gate connected to the second node;
   a fourth transistor with one of its nodes connected to the second node, the other node connected to the second power supply, and its gate connected to the first node;
   a fifth transistor with one of its nodes connected to a first bit line, the other node connected to the first node, and its gate connected to a first word lme;
   a sixth transistor with one of its nodes connected to a second bit line constituting a first complementary bit line pair with the first bit fine, the other node connected to the second node, and tis gate connected to the first word lime:
   a seventh transistor with one of its nodes connected to a third bit line, the other node connected to the first node, and its gate connected to a second word line; and
   an eighth transistor with one of its nodes connected to a fourth bit line constituting a second complementary bit line pair with the third bit line, the other node connected to the second node, and its gate connected to the second word line, wherein
   the third and fourth transistors are each constituted by a plurality of three-dimensional transistors of a first conductivity type formed in a first layer side by side in a second direction perpendicular to a first direction, the first direction being a direction which channel portions of the first to eighth transistors extend,
   the first and second transistors are each constituted by a three-dimensional transistor of a second conductivity type different from the first conductivity type formed in a second layer located above the first layer, and overlap the third and fourth transistors, respectively, at least partly as viewed in plan, and
   the fifth to eighth transistors each include a three-dimensional transistor of the first conductivity type formed in the second layer; and wherein
   the three-dimensional transistors of the first to fourth transistors are constituted by a stacked transistor structure comprising at least one nanowire extending through a gate electrode in the first direction and one of first and second conductivity types semiconductor layers arranged on both ends of the at least one nanowire.

* * * * *